(12) United States Patent
Campbell et al.

(10) Patent No.: US 10,273,371 B2
(45) Date of Patent: *Apr. 30, 2019

(54) METHOD OF FORMING A SLURRY OF ENCAPSULATED PIGMENT FOR AN AQUEOUS TOPCOAT COATING COMPOSITION

(71) Applicant: BASF Coatings GmbH, Muenster (DE)

(72) Inventors: Donald Campbell, Hartland, MI (US); Prasad T Ramanna, Kannada (IN); Rajesh Rathod, Mangalore (IN); Paragkumar Thanki, Mangalore (IN)

(73) Assignee: BASF Coatings GmbH, Muenster (DE)

( * ) Notice: Subject to any disclaimer, the term of this patent is extended or adjusted under 35 U.S.C. 154(b) by 117 days.

This patent is subject to a terminal disclaimer.

(21) Appl. No.: 15/218,350

(22) Filed: Jul. 25, 2016

(65) Prior Publication Data

US 2018/0022941 A1    Jan. 25, 2018

(51) Int. Cl.
| | | |
|---|---|---|
| *C09D 5/00* | (2006.01) | |
| *C23C 16/56* | (2006.01) | |
| *C09D 5/36* | (2006.01) | |
| *C09D 7/41* | (2018.01) | |
| *C09D 5/08* | (2006.01) | |

(Continued)

(52) U.S. Cl.
CPC ............ *C09D 5/36* (2013.01); *C09D 5/00* (2013.01); *C09D 5/084* (2013.01); *C09D 5/086* (2013.01); *C09D 7/41* (2018.01); *C09D 133/02* (2013.01); *C09D 167/02* (2013.01); *C09D 175/06* (2013.01); *C23C 16/56* (2013.01)

(58) Field of Classification Search
None
See application file for complete search history.

(56) References Cited

U.S. PATENT DOCUMENTS

| 4,434,009 A | 2/1984 | Banba |
|---|---|---|
| 4,490,499 A | 12/1984 | Huybrechts |

(Continued)

FOREIGN PATENT DOCUMENTS

| EP | 0399427 A1 | 11/1990 |
|---|---|---|
| EP | 0458245 A1 | 11/1991 |

(Continued)

*Primary Examiner* — Francisco W Tschen
(74) *Attorney, Agent, or Firm* — Oblon, McClelland, Maier & Neustadt, L.L.P.

(57) ABSTRACT

A method of forming a passivated pigment slurry includes combining a resin and a pigment to form a pigment-resin slurry, wherein the pigment includes a plurality of flakes each having a surface. After combining, the method includes firstly reacting an orthosilicate and the pigment in the presence of the resin to form a coated pigment-resin slurry. The coated pigment-resin slurry includes the resin and a coated pigment including the plurality of flakes each encapsulated by a first layer formed from the orthosilicate on the surface. The method further includes, concurrent to or after firstly reacting, secondly reacting the coated pigment-resin slurry and an organosilane compound having a hydrolysable group and an organic group to coat the first layer and form the passivated pigment slurry. The passivated pigment slurry includes the resin and a passivated pigment including the plurality of flakes each coated with a second layer disposed on the first.

18 Claims, 2 Drawing Sheets

(51) Int. Cl.
*C09D 133/02* (2006.01)
*C09D 167/02* (2006.01)
*C09D 175/06* (2006.01)

(56) References Cited

U.S. PATENT DOCUMENTS

| | | | |
|---|---|---|---|
| 5,151,125 | A | 9/1992 | Kuwajima et al. |
| 5,156,677 | A | 10/1992 | Carpenter et al. |
| 5,168,105 | A | 12/1992 | Anderson, Jr. et al. |
| 5,256,706 | A | 10/1993 | Carpenter et al. |
| 5,466,286 | A | 11/1995 | Briselli et al. |
| 5,498,781 | A | 3/1996 | Hall et al. |
| 7,699,927 | B2 | 4/2010 | Henglein et al. |
| 9,777,180 | B2 * | 10/2017 | Campbell ............ C09D 17/004 |
| 2004/0077750 | A1 | 4/2004 | Sapper |
| 2005/0072338 | A1 | 4/2005 | Weintz et al. |
| 2006/0150864 | A1 * | 7/2006 | Hashizume ............... C09C 1/64 106/400 |
| 2006/0155022 | A1 | 7/2006 | Hupp et al. |
| 2007/0034112 | A1 * | 2/2007 | Mronga ................ C09C 1/0015 106/31.6 |
| 2008/0249209 | A1 | 10/2008 | Trummer et al. |
| 2011/0135832 | A1 | 6/2011 | Lane et al. |
| 2011/0197782 | A1 * | 8/2011 | Wang .................... B82Y 30/00 106/31.9 |
| 2012/0034457 | A1 | 2/2012 | Low et al. |
| 2013/0078438 | A1 | 3/2013 | Nakajima et al. |
| 2013/0101813 | A1 | 4/2013 | Nakajima et al. |
| 2013/0122307 | A1 | 5/2013 | Grabbe et al. |
| 2013/0136865 | A1 | 5/2013 | Groenewolt et al. |
| 2013/0202893 | A1 | 8/2013 | Rihan et al. |

FOREIGN PATENT DOCUMENTS

| | | |
|---|---|---|
| EP | 0468293 A1 | 1/1992 |
| EP | 0471972 A1 | 2/1992 |
| EP | 0575859 A1 | 12/1993 |
| EP | 1728819 A2 | 12/2006 |
| EP | 2361953 A1 | 8/2011 |

* cited by examiner

METHOD OF FORMING A SLURRY OF ENCAPSULATED PIGMENT FOR AN AQUEOUS TOPCOAT COATING COMPOSITION

TECHNICAL FIELD

The disclosure relates to a method of forming a passivated pigment slurry for an aqueous topcoat coating composition, a method of forming the aqueous topcoat coating composition, and a method of forming an aqueous topcoat coating system.

BACKGROUND

Aqueous topcoat coating compositions, i.e., waterborne topcoat coating compositions or water-based topcoat coating compositions or waterbasecoats, are generally applied to a substrate to provide a durable, protective, and attractive cured film. One type of aqueous topcoat coating composition, a basecoat/clearcoat coating composition, may be applied in two layers. For example, a first layer formed from a pigmented basecoat coating composition may be applied to the substrate, and then a second layer formed from a clearcoat coating composition may be applied to the first layer. In contrast, another type of aqueous topcoat coating composition, a single-stage or monocoat coating composition, may be applied to the substrate in one layer.

Aqueous topcoat coating compositions generally include low volatile organic content and may be especially suitable for applications requiring cured films having metallic and/or pearlescent effects. Such aqueous topcoat coating compositions may include flake pigments to provide the cured film with the metallic and/or pearlescent effects. Metallic aluminum pigments may react with water in these aqueous topcoat coating compositions to produce hydrogen gas if the aluminum is not sufficiently passivated against corrosion. Such hydrogen gas may present a hazard for storage and handling of the aqueous topcoat coating compositions.

In addition, pearlescent pigments coated with certain metal oxides such as titanium dioxide may diminish a durability of cured films formed from aqueous topcoat coating compositions which include pearlescent pigments. For example, absorption of light by the titanium dioxide results in the production of electrons, or radicals, which may photodegrade organic binders if the metal oxides are not insulated from the organic binders in the final cured film.

The most effective treatment for preventing the gassing of aluminum flake pigments is the chromate type treatment such as that described by Kondis in U.S. Pat. No. 4,693,754, or commercially available as Hydrolux® aluminums from Eckart GmbH of Hartenstein, Germany. This chromate type treatment can prevent gassing even in the presence of ionic clay thickeners and oxidizing iron oxide pigments. However, a toxicity of chromate or vanadate requires multiple washing steps and subsequent treatment or disposal of the toxic wash materials.

Silicate encapsulation of aluminum flake pigments is described by Iler using alkalai metal silicates as in U.S. Pat. No. 2,885,366. This process uses multiple washing and filtration steps to remove inorganic salts. Failure to remove these inorganic salts results in a highly hygroscopic and water-sensitive basecoat film. After silicate encapsulation, the resulting product is a silica encapsulated aluminum flake in powder form.

There are also patents describing the use of organic coatings or organosilane coatings for passivation, such as U.S. Pat. Nos. 4,213,886 and 5,156,677. In cases which do not require filtration to produce a powdered product, corrosion-resistance in the presence of comparatively more corrosive environments is insufficient.

Another class of treatment uses organosilicates to produce a multilayer silica barrier formed from a plurality of silicate layers having low water permeability and disposed on the aluminum surface. These treatments are also able to provide adequate passivation in highly corrosive environments. Examples of this class of treatment are described in U.S. Pat. No. 9,000,068 (comparative example 18) and U.S. Pat. No. 8,900,658, and are commercially available as Hydrolan® aluminums from Eckart GmbH of Hartenstein, Germany. These plurality of silicate layers can be subsequently treated with organosilanes to improve compatibility with resinous binders. The final stage of these treatments include filtration to removes excess solvents and catalysts to provide a powdered or paste-like product. If this filtration step is omitted, then a level of organic solvent results in high basecoat volatile organic compound content and the liquid dispersion of flake pigments is not stable to settling.

Problem

Large amounts of solvent are used to dilute flake pigments during encapsulation with organosilicates. These dispersions are unstable to settling of the flake pigment and cannot be stored as prepared. Furthermore, without removal of these solvents, waterbasecoats prepared with high a content of these slurries contain too much organic solvent to meet the volatile organic compound content requirements for waterbasecoats. Removal of these solvents to prepare a storage-stable paste or solid material results in waste solvent that must be disposed or purified before reuse. Finally, when these solid flake pigments thus obtained are redispersed into organic solvent and resin as a slurry, the resulting slurry is also unstable to settling and cannot be stored for later use. The inability to store flake pigment slurries results in the need to produce multiple small batches of slurry for each basecoat batch. The ability to store larger slurry batches without settling dramatically reduces the number of slurry batches produced and the labor required.

Solution

By replacing a portion of the organic solvent in the organosilicate encapsulation step with an organic resin, flake pigment slurries are produced with low volatile organic compound contents. The flake pigment slurries thus prepared do not require removal of excess organic solvent, catalyst, or reactants to be suitable for use directly in waterbasecoats, and thereby eliminate the expense of disposing or recycling the waste, i.e., the excess organic solvent, catalyst, and/or reactants. These flake pigment slurries are also unexpectedly stable to settling and can be stored for later use.

SUMMARY

A method of forming a passivated pigment slurry includes combining a resin and a pigment to form a pigment-resin slurry, wherein the pigment includes a plurality of flakes each having a surface. After combining, the method includes firstly reacting an orthosilicate and the pigment in the presence of the resin to form a coated pigment-resin slurry. The coated pigment-resin slurry includes the resin and a coated pigment including the plurality of flakes each encapsulated by a first layer formed from the orthosilicate and disposed on the surface. The method further includes, after firstly reacting, secondly reacting the coated pigment-resin slurry and an organosilane compound having a hydrolysable group and an organic group to coat the first layer and thereby form the passivated pigment slurry. The passivated pigment slurry includes the resin and a passivated pigment including the plurality of flakes each coated with a second layer disposed on the first layer.

A method of forming an aqueous topcoat coating composition includes blending the passivated pigment slurry, water, and at least one water-miscible film-forming binder to form the aqueous topcoat coating composition.

A method of forming an aqueous topcoat coating system includes applying a film formed from the aqueous topcoat coating composition to a substrate, and curing the film to form the aqueous topcoat coating system.

The passivated pigment slurry has excellent stability in aqueous topcoat coating compositions and excellent resistance to corrosion. Further, the plurality of flakes each coated with the second layer exhibit minimal settling in the passivated pigment slurry when the passivated pigment slurry is stored in a container.

The disclosed method provides a treated flake pigment slurry that is surprisingly well passivated, even when incorporated into aqueous topcoat coating compositions containing a colloidal synthetic layered silicate. Treating the pigment in the presence of the resin, i.e., encapsulating the plurality of flakes by the first layer in the presence of the resin, and also secondly reacting the coated pigment-resin slurry with the organosilane compound in the presence of the resin, provides unexpected improvements in stability toward settling as compared to other pigment slurries not formed in the presence of a resin. Consequently, the passivated pigment slurry may be formed or produced prior to forming the aqueous topcoat coating composition but may be stored over time, which may decrease manufacturing and logistical costs associated with forming the aqueous topcoat coating composition.

In this disclosure, "a," "an," "the," "at least one," and "one or more" are used interchangeably to indicate that at least one of the item is present, and a plurality of such items may be present unless the context clearly indicates otherwise. All numerical values of parameters, quantities, or conditions in this disclosure, including the appended claims, are to be understood as being modified in all instances by the term "about" whether or not "about" actually appears before the numerical value. "About" indicates that the stated numerical value allows some slight imprecision, i.e., with some approach to exactness in the value; approximately or reasonably close to the value; nearly. If the imprecision provided by "about" is not otherwise understood in the art with this ordinary meaning, then "about" indicates at least variations that may arise from customary methods of measuring and using such parameters. In addition, disclosure of a range includes disclosure of all values and further divided ranges within the entire range. Each value within a range and the endpoints of a range are hereby all disclosed as separate embodiments. The terms "comprises," "comprising," "includes," "including," "has," and "having" are inclusive and therefore specify the presence of stated items, but do not preclude the presence of other items. As used in this disclosure, the term "or" includes any and all combinations of one or more of the listed items.

DETAILED DESCRIPTION

Figure 1:
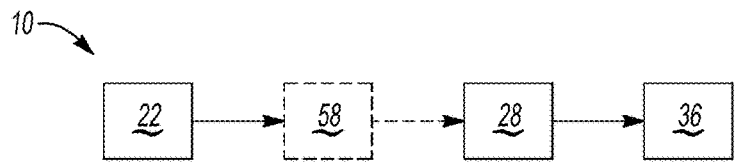
FIG. 1 is a flowchart of a method of forming a passivated pigment slurry for an aqueous topcoat coating composition.
Figure 4:
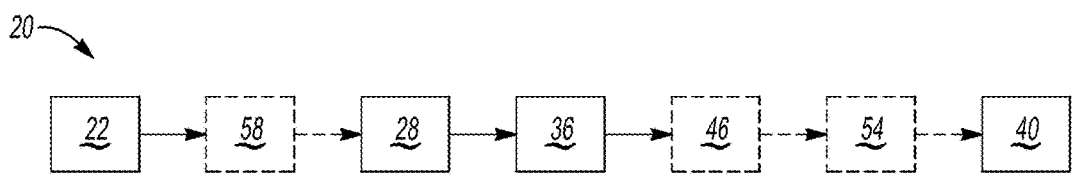
FIG. 4 is a flowchart of a method of forming an aqueous topcoat coating composition.

Referring to the Figures, wherein like reference numerals refer to like elements, a method 10 of forming a passivated pigment slurry 12 (FIG. 2) for an aqueous topcoat coating composition 14 (FIG. 6) is shown generally in FIG. 1. Likewise, a method 20 of forming the aqueous topcoat coating composition 14 is shown generally in FIG. 4, and a method 30 of forming an aqueous topcoat coating system 16 (FIG. 6) is shown generally in FIG. 5. The passivated pigment slurry 12 of this disclosure exhibits excellent settling-, corrosion-, oxidation-, and/or photo-degradation-resistance and is therefore suitable for applications requiring durable and attractive cured films 18 (FIG. 6) formed from the aqueous topcoat coating composition 14 which have a metallic and/or pearlescent effect or color.

As such, the methods 10, 20, 30 of forming the passivated pigment slurry 12, aqueous topcoat coating composition 14, and aqueous topcoat coating system 16 may be useful for automotive applications. Alternatively, the methods 10, 20, 30 may be useful for non-automotive applications such as, but not limited to, marine and industrial applications.

Referring now to FIG. 1, the method 10 of forming the passivated pigment slurry 12 for the aqueous topcoat coating composition 14 may generally be characterized as a two-part method 10. That is, part one of the method 10 may be characterized as an encapsulation process which occurs in the presence of a resin, and part two of the method 10 may be characterized as a treatment process which also occurs in the presence of the resin, as set forth in more detail below.

Forming a Pigment-Resin Slurry 12

Figure 3:
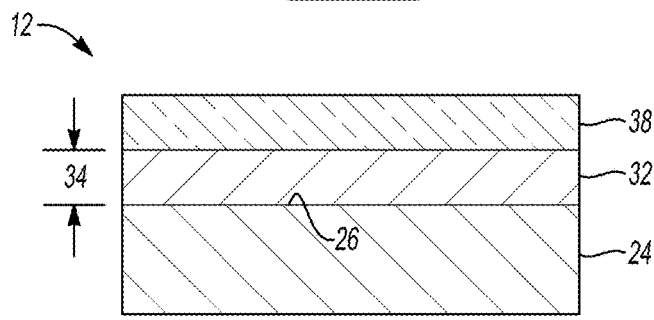
FIG. 3 is a schematic illustration of a cross-sectional view of the passivated pigment slurry of FIG. 2 taken along section lines 3-3.

As described with reference to FIG. 1, the method 10 of forming the passivated pigment slurry 12 includes combining 22 a resin and a pigment to form a pigment-resin slurry, wherein the pigment includes a plurality of flakes 24 (FIG. 2) each having a surface 26 (FIG. 3). That is, the pigment may be characterized as a flake pigment and each of the plurality of flakes 24 may have, for example, a platelet shape, a lamellar shape, or a coin shape. Further, the pigment may be characterized as, for example, a metallic flake pigment, a pearlescent flake pigment, and/or an optically-variable pigment and may be configured for providing the cured film 18 (FIG. 6) formed from the aqueous topcoat coating composition 14 with a metallic and/or pearlescent effect or color or luster.

Metallic flake pigments may include, for example, aluminum flake pigments, copper flake pigments, zinc flake pigments, stainless steel flake pigments, and bronze flake pigments. Pearlescent flake pigments may include titanium dioxide-coated mica pigments and iron oxide-coated mica pigments. Such pearlescent flake pigments may generally have a platelet or lamellar shape, orient substantially parallel to a substrate 44 (FIG. 6), and thereby provide the cured film 18 (FIG. 6) with a color that varies according to viewing angle, or a goniochromatic effect.

Therefore, non-limiting examples of pigments may include aluminum pigments, coated aluminum pigments, copper pigments, zinc pigments, stainless steel pigments, gold-bronze pigments, titanium pigments, zirconium pigments, tin pigments, iron pigments, pigments of alloys of these metals, flake-form glass pigments, $Al_2O_3$ coated pigments, $SiO_2$ coated pigments, $TiO_2$ coated pigments, $Fe_2O_3$ coated pigments, and mica pigments. That is, the pigment may be coated with one or more metal oxides such as titanium dioxide, silicon dioxide, aluminum oxide, and iron oxide. In one non-limiting example, the surface 26 may be formed from aluminum. In another non-limiting example, the surface 26 may be formed from titanium dioxide coated or disposed on a mica. In another non-limiting example, the surface 26 may be formed from a metal oxide coated or disposed on aluminum.

The plurality of flakes 24 may have an average diameter of at least 1 μm, e.g., at least about 5 μm and not greater than about 200 μm e.g., not greater than about 50 μm. Further, the pigment may have an aspect ratio of at least about 5, e.g., at least about 15. The aspect ratio may not be more than about 1,000, e.g., not more than about 500. The aspect ratio may be obtained by dividing an average diameter of a flake 24 (or a length of a longest axis of a non-circular flake 24) by an average thickness of the flake 24. The pigment may have an aspect ratio of at least about 5 to provide a noticeable travel of the cured film 18 (FIG. 6), i.e., a difference between brightness when viewed along a face of the cured film 18 and darkness when viewed at an oblique angle to the cured film 18. The average diameter may be obtained by calculating a volume average from a size distribution measured by a technique such as laser diffraction, micromesh sheaving, Coulter Counter, or the like. The average thickness may be calculated based on a hiding power and a density of the pigment.

Typical metallic pigments are aluminum pigments, which may include non-leafing flakes prepared as pastes via a milling process that combines aluminum with a lubricant and a pasting agent such as mineral oil, aromatic naphthas, and aliphatic naphthas. Non-limiting examples of the lubricant may include fatty acids such as oleic acid, linoleic acid, linolenic acid, ricinolic acid, elaidic acid, palmitoleic acid, gadoleic acid, and erucic acid. After the milling process, organic liquids, inhibiting agents, and/or emulsifiers can be added to prepare the aluminum pigment.

A typical aluminum pigment may include, based on 100 parts by weight of the aluminum pigment, aluminum flake present in an amount of from about 55 parts by weight to about 75 parts by weight; organic liquid present in an amount of from about 22 parts by weight to about 44 parts by weight; oleic acid or other lubricant present in an amount of from about 1 part by weight to about 3 parts by weight; and inhibiting agents and/or emulsifiers present in an amount of from about 0 parts by weight to about 5 parts by weight. The aluminum flake may have an average size distribution of from about 3 micrometers to about 50 micrometers, e.g., from about 8 micrometers to about 32 micrometers. A shape and/or size distribution of the plurality of flakes 24 among commercially available aluminum pigments may provide a difference in brilliance, sparkle, two-tone appearance, smoothness, lightness, and a difference in travel of the cured film 18.

Colored aluminum pigments may include an aluminum flake coated with a thin layer formed from iron oxide. As a result of wavelength interference at the thin layer, the cured film 18 may exhibit a metallic effect and a color effect. Examples of colored aluminum pigments may include titanium dioxide-coated aluminum pigments, iron oxide-coated aluminum pigments, and mixed oxide-coated aluminum pigments.

Approaches to producing metallic or pearlescent or optically-variable pigments may generally adopt one of two techniques, both of which may position a low refractive index layer formed from silica and having a refractive index of, for example, about 1.5 between reflective layers. In a first approach, a stack of layers may be provided on a temporary substrate such as a flexible web. Combinations of transparent dielectric layers, semi-opaque metal layers, and/or metal reflecting layers may be deposited on the temporary substrate to form a multilayer thin film interference structure. The multilayer thin film interference structure may have at least one metal reflecting layer, at least one transparent dielectric layer, and at least one semi-transparent metal layer. Such metal reflecting layers, transparent dielectric layers, and/or semi-transparent metal layers may be formed from, for example, aluminum, chromium, magnesium fluoride, and/or silicon dioxide. Various combinations of such layers may be utilized to achieve a desired optically-variable effect in the cured film 18 formed from the aqueous topcoat coating composition 14. Subsequently, the stack of layers may be separated from the temporary substrate and subdivided into flakes 24. The pigment may be produced by physical techniques such as physical vapor deposition onto the temporary substrate, separation from the temporary substrate, and subsequent comminution, or by other deposition techniques, e.g., plasma, sputtering, etc., and subsequent deflaking of a decomposition product.

In a second approach of producing metallic or pearlescent or optically-variable pigments, a platelet-shaped, opaque metallic substrate may be coated or encapsulated with successive layers of selectively absorbing metal oxides and non-selectively absorbing layers of carbon, metal sulfide, metal, or metal oxide. The successive layers may be applied by techniques such as chemical vapor deposition and sol-gel processes. Aluminum may be used as a metal reflecting layer based on cost and commercial availability, although other materials, such as gold, copper, or silver may also be used.

A non-limiting example of a pigment is commercially available under the trade name Hydrolan® 2156 Aluminum Paste from Eckart GmbH of Hartenstein, Germany.

For the method 10, the resin may be any resin used to prepare aqueous topcoat coating compositions 14. Generally, the resin may be compatible with one or more solvents and/or at least one water-miscible film-forming binder of the aqueous topcoat coating composition 14 as set forth in more detail below.

For example, the resin may be selected from polyester resins, acrylic polymer resins such as poly(meth)acrylate resins, where (meth)acrylate refers to acrylate resins and/or methacrylate resins, polyurethane resins, aminoplast resins, polyether resins, and combinations thereof. Suitable non-limiting examples of resins may have a carboxylic acid group or an anhydride group that can be ionized with an amine or another base during formation of the aqueous topcoat coating composition 14 so that the resins are water-dilutable or water-dispersible, i.e., water-miscible.

Polyester resins may be prepared by reacting: (a) polycarboxylic acids or their esterifiable derivatives together with monocarboxylic acids, and (b) polyols together with monools. Non-limiting examples of (a) polycarboxylic acids or their esterifiable derivatives include phthalic acid, isophthalic acid, terephthalic acid, halophthalic acids such as tetrachloro- or tetrabromophthalic acid, adipic acid, glutaric acid, azelaic acid, sebacic acid, fumaric acid, maleic acid, trimellitic acid, pyromellitic acid, tetrahydrophthalic acid, hexahydrophthalic acid, 1,2-cyclohexanedicarboxlic acid, 1,3-cyclohexane-discarboxlic acid, 1,4-cyclohexane-dicarboxlic acid, 4-methylhexahydrophthalic acid, endomethylenetetrahydropthalic acid, tricyclodecane-dicarboxlic acid, endoethylenehexahydropthalic acid, camphoric acid, cyclohexanetetracarboxlic acid, and cyclobutanetetracarboxylic acid. The cycloaliphatic polycarboxylic acids may be employed either in cis or trans form or as a mixture of the two forms. Esterifiable derivatives of these polycarboxylic acids may include their single or multiple esters with aliphatic alcohols having from 1 carbon atom to 4 carbon atoms or hydroxy alcohols having up to 4 carbon atoms such as the methyl and ethyl esters as well as the anhydrides of these polycarboxylic acids.

Non-limiting examples of suitable monocarboxylic acids that can be used together with the (a) polycarboxylic acids may include benzoic acid, tert-butylbenzoic acid, lauric acid, isonoanoic acid, and fatty acids of naturally occurring oils.

Non-limiting examples of suitable (b) polyols may include ethylene glycol, butylene glycol, neopentyl glycol, propanediols, butanediols, hexanediols, diethylene glycol, cyclohexanediol, cyclohexanedimethanol, trimethylpentanediol, ethylbutylpropanediol ditrimethylolpropane, trimethylolethane, trimethylolpropane, glycerol, pentaerythritol, dipentaerythritol, tris-hydroxyethyl isocyanate, polyethylene glycol, and polypropylene glycol.

Non-limiting examples of monoalcohols that may be used together with the (b) polyols may include butanol, octanol, lauryl alcohol, and ethoxylated and propoxylated phenols.

Non-limiting examples of suitable optional modifying components may include compounds which contain a group which is reactive with respect to a functional group of the polyester resin, including polyisocyanates, diisocyanates, diepoxide compounds, monoisocyanates, and/or monoepoxide compounds.

Polyester resin polymerization may be carried out at temperatures of from about 180° C. to about 280° C. in the presence of an esterification catalyst. Typical esterification catalysts may include protonic acids, Lewis acids, titanium alkoxides, dialkyltin oxides, lithium octanoate, dibutyltin oxide, dibutyltin dilaurate, and para-toluenesulfonic acid under reflux with small quantities of a suitable solvent as an entraining agent, such as an aromatic hydrocarbon, e.g., xylene, or a (cyclo)aliphatic hydrocarbon, e.g., cyclohexane. Polyester resin polymerization may be carried out to a desired acid number value when acid groups are ionized with an amine or ammonia when dispersed in the aqueous topcoat coating composition 14, or may employ a polyethylene glycol segment to impart water-dispersibility when dispersed in the aqueous topcoat coating composition 14. Suitable polyesters may have an acid number value of greater than 20.

Suitable poly(meth)acrylate polymers may be polymerized with functionality that can be ionized at the time the passivated pigment slurry 12 is introduced into the aqueous topcoat coating composition 14, such as carboxyl groups, or may be polymerized with a nonionic dispersing polyethylene glycol segment. Examples of suitable carboxylic acid monomers are α,β-ethylenically unsaturated monocarboxylic acids containing from 3 carbon atoms to 5 carbon atoms, such as acrylic, methacrylic, and crotonic acids; α,β-ethylenically unsaturated dicarboxylic acids containing from 4 carbon atoms to 6 carbon atoms; the anhydrides and monoesters of those acids, such as fumaric acid, maleic acid, and itaconic acid; and anhydrides and their monoesters with alcohols, such as methanol, ethanol, propanol, isopropanol, butanol, isobutanol, and tert-butanol, such as maleic acid monobutyl ester.

The poly(meth)acrylate polymers may also have another functional group that reacts during curing 42 (FIG. 5) of the aqueous topcoat coating composition 14, for example, hydroxyl or carbamate functional groups. Non-limiting examples of hydroxyl-functional monomers may include hydroxyethyl (meth)acrylate, hydroxypropyl (meth)acrylates, hydroxybutyl (meth)acrylates, hydroxyhexyl (meth)acrylates, propylene glycol mono(meth)acrylate, 2,3-dihydroxypropyl (meth)acrylates, pentaerythritol mono(meth)acrylate, polypropylene glycol mono(meth)acrylates, polyethylene glycol mono(meth)acrylates, reaction products of these with epsilon-caprolactone, other hydroxyalkyl (meth)acrylates having branched or linear alkyl groups of up to about 10 carbon atoms, and mixtures of these. Carbamate groups may generally be introduced after polymerization of a hydroxy monomer by transcarbamation. The poly(meth)acrylate polymers may have an acid number value of greater than 20.

Examples of suitable comonomers may include, without limitation, alkyl and cycloalkyl esters, nitriles, and amides of acrylic acid, methacrylic acid, and crotonic acid; diesters of α,β-ethylenically unsaturated dicarboxylic acids containing from 4 carbon atoms to 6 carbon atoms; and vinyl esters, vinyl ethers, vinyl ketones, and aromatic or heterocyclic aliphatic vinyl compounds. Representative examples of suitable esters of acrylic, methacrylic, and crotonic acids may include, without limitation, esters from reaction with saturated aliphatic alcohols containing from 1 carbon atom to 20 carbon atoms, such as methyl, ethyl, propyl, isopropyl, n-butyl, isobutyl, tert-butyl, hexyl, 2-ethylhexyl, dodecyl, 3,3,5-trimethylhexyl, stearyl, lauryl, cyclohexyl, alkyl-substituted cyclohexyl, alkanol-substituted cyclohexyl, such as 2-tert-butyl and 4-tert-butyl cyclohexyl, 4-cyclohexyl-1-butyl, 2-tert-butyl cyclohexyl, 4-tert-butyl cyclohexyl, 3,3,5,5,-tetramethyl cyclohexyl, tetrahydrofurfuryl, and isobornyl acrylates, methacrylates, and crotonates, vinyl acetate, vinyl propionate, vinyl ethyl ether, and vinyl ethyl ketone, styrene, α-methyl styrene, vinyl toluene, 2-vinyl pyrrolidone, and p-tert-butylstyrene.

Acrylic polymers may be prepared by a technique including heating monomers in the presence of a polymerization initiating agent and optionally a chain transfer agent. Acyrlic polymerization may be carried out in a solution of solvents.

Suitable polymerization initiating agents may include organic peroxides, such as dialkyl peroxides, e.g., di-t-butyl peroxide, peroxyesters, such as t-butyl peroxy 2-ethylhexanoate and t-butyl peracetate, peroxydicarbonates, diacyl peroxides, hydroperoxides such as t-butyl hydroperoxide, peroxyketals, azo compounds such as 2,2azobis(2-methylbutanenitrile) and 1,1'-azobis(cyclohexanecarbonitrile), and combinations of these. Typical chain transfer agents may include mercaptans such as octyl mercaptan, n- or tert-dodecyl mercaptan, halogenated compounds, thiosalicylic acid, mercaptoacetic acid, mercaptoethanol, other thiol alcohols, and dimeric alpha-methyl styrene.

Acrylic polymerization may be carried out at temperatures of from about 20° C. to about 200° C. The polymerization reaction may occur at the temperature at which a solvent or solvent mixture refluxes, although with proper control a temperature below the reflux may be maintained. The initiating agents should be chosen to match the temperature at which the polymerization reaction is carried out, so that the half-life of the initiating agents at that temperature may be no more than about thirty minutes. The solvent or solvent solution may be heated to the reaction temperature and the monomers and initiating agents may be added at a controlled rate over a period of time, usually between 2 hours and 6 hours. The chain transfer agent or any additional solvent may also be fed in at a controlled rate during this time. The temperature of the solution may then be maintained for a period of time to complete the polymerization reaction. Optionally, an additional initiating agent may be added to ensure complete conversion.

Polyether polyols, particularly polyethylene glycols and polypropylene glycols, may also be suitable as the resin. Suitable polyethylene glycols may have a number average molecular weight of from about 800 g/mol to about 50,000 g/mol, e.g., from about 900 g/mol to about 2,000 g/mol. Suitable polypropylene glycols may have a number average molecular weight of from about 400 g/mol to about 30,000 g/mol. Suitable polyether polyols are commercially available in varying molecular weights from BASF Corporation of Florham Park, N.J. under the trademark Pluracol®.

Non-limiting examples of aminoplast resins may include materials having active methylol groups or methylalkoxy groups or imino groups. Non-limiting examples may include melamine formaldehyde resins, including monomeric or polymeric melamine formaldehyde resins and partially or fully alkylated melamine formaldehyde resins, and urea resins such as methylol ureas, urea formaldehyde resin, and alkoxy ureas such as butylated urea formaldehyde resin. The melamine resin may be selected according to a solubility or dispersability in the aqueous topcoat coating composition 14.

Among other benefits, forming the pigment-resin slurry, i.e., by including the resin in the slurry, may reduce an amount of organic solvent required, which may permit the aqueous topcoat coating composition 14 of relatively low volatile organic content to be prepared from the passivated pigment slurry 12.

Referring again to the method 10, combining 22 may include agitating or stirring the pigment and the resin together. That is, combining 22 may include slurrying the pigment and the resin at a weight ratio of parts by weight pigment to parts by weight resin of from about 100:30 to about 30:100, e.g., from about 1:100 to about 30:100.

The pigment-resin slurry may also include one or more solvents, i.e., an organic liquid that is water-soluble or partially water-soluble, which may be included as needed to reduce the viscosity and facilitate mixing. The solvent(s) may act as a diluent and provide excellent separation between adjacent ones of the plurality of flakes 24 present in the pigment-resin slurry. Non-limiting examples of suitable solvents may include ethylene glycol monoalkyl ethers such as ethylene glycol monobutyl ether, propylene glycol monoalkyl ethers such as propylene glycol monomethyl ether, propylene glycol monopropyl ether, and propylene glycol monobutyl ether, and dipropylene glycol ethers such as dipropylene glycol monomethyl ether. A specific example of the solvent is 2-butoxyethanol, which is commercially available under the trade name Butyl Cellosolve™ from The Dow Chemical Company of Midland, Mich.

In addition, the pigment-resin slurry may also include a catalyst, such as water and/or at least one base. The at least one base may be selected from ammonia and amines such as methylamine, ethylamine, isopropylamine, n-butylamine, isobutylamine, triethanolamine, triethylamine, ethylenediamine, diethylamine, dipropylamine, diisopropylamine, dibutylamine, tri-n-propylamine, tri-n-butylamine, dimethylamine, dimethylethanolamine, dimethylethylamine, methoxylethylamine, ethylenediamine, 3-aminopropyl triethoxysilane, and combinations thereof. The amines(s) may be water-miscible and have an octanol/water partition coefficient less than 1.0 at a pH of 9. A pH of the at least one amine may be selected to mitigate any potential corrosion of the pigment upon exposure to water when the pigment is first combined with the resin to form the pigment-resin slurry. For example, combining 22 may include slurrying an alkyl primary amine having from 1 carbon atom to 4 carbon atoms such as methylamine, ethylamine, isopropylamine, n-butylamine, isobutylamine, and/or ethylenediamine.

As a non-limiting example, the pigment-resin slurry may include a first amine and a second amine, and the first and second amines may have different base strengths. For example, the first amine may be characterized as a comparatively stronger base and the second amine may be characterized as a comparatively weaker base. Stated differently, the first amine may be a comparatively stronger amine catalyst and the second amine may be a comparatively weaker amine catalyst. The first amine may have a logarithmic acid dissociation constant, $pK_a$, of greater than or equal to 9, and the second amine may have a $pK_a$ of less than 9. A suitable non-limiting example of the first amine is n-butylamine, and a suitable non-limiting example of the second amine is dimethylethanolamine. The first amine, the second amine, and any ammonia may together make up a total amine component of the pigment-resin slurry.

Therefore, referring again to the method 10, combining 22 may further include slurrying the first amine having a $pK_a$ of greater than or equal to 9, the second amine having a $pK_a$ of less than 9, the pigment, the resin, and optionally a solvent, such that the pigment-resin slurry is a compatible mixture. As such, the resin is present in the pigment-resin slurry.

Further, the methods 10, 20, 30 may be characterized as non-acidic techniques for forming the passivated pigment slurry 12, aqueous topcoat coating composition 14, and aqueous topcoat coating system 16 rather than two-step acid-base or base-acid techniques.

Part One: Silica Encapsulation of the Plurality of Flakes 24 in the Presence of the Resin Referring again to FIG. 1, the method 10 also includes, after combining 22, firstly reacting 28 an orthosilicate and the pigment in the presence of the resin to form a coated pigment-resin slurry. That is, firstly reacting 28 may represent the aforementioned part one of the method 10, i.e., pigment encapsulation that occurs in the presence of the resin.

Non-limiting examples of suitable orthosilicates may include tetraethyl orthosilicate (TEOS), tetramethyl orthosilicate (TMOS), tetrapropyl orthosilicate, tetrabutyl orthosilicate, and combinations thereof. For example, the method 10 may include firstly reacting 28 tetraethyl orthosilicate and the pigment in the presence of the resin to form the coated pigment-resin slurry. The resulting coated pigment-resin slurry thus includes the resin and a coated pigment.

As described with reference to FIG. 3, the coated pigment includes the plurality of flakes 24 each encapsulated by a first layer 32 formed from the orthosilicate and disposed or deposited on the surface 26. That is, firstly reacting 28 may include encapsulating or surrounding each of the plurality of flakes 24 with the first layer formed from the orthosilicate.

More specifically, the first layer 32 may be deposited on the surface 26 of each of the plurality of flakes 24 via a hydrolysis reaction and a condensation reaction. The hydrolysis reaction may occur between the orthosilicate, e.g., tetraethyl orthosilicate, and water, e.g., a hydroxyl group present on the surface 26 of each of the plurality of flakes 24. For example, the orthosilicate may hydrolyze in the presence of water to form silicic acid. The silicic acid may then condense to form silica and water during the condensation reaction. The resulting first layer 32 formed from the orthosilicate may exhibit excellent resistance to water permeability and may therefore provide the plurality of flakes 24 with protection against corrosion, oxidation, and photo-degradation.

Firstly reacting 28 may include blending the orthosilicate and the pigment in the presence of the resin, i.e., blending the orthosilicate and the pigment-resin slurry, at a temperature of from about 10° C. to about 100° C. for a duration of from about 30 minutes to about 200 hours. That is, the hydrolysis reaction may occur at a temperature of from about 10° C. to about 100° C., e.g., from about 10° C. to about 70° C. for a duration of from about 30 minutes to about 48 hours, e.g., from about 1 hour to about 24 hours. When a comparatively stronger amine, e.g., the first amine, is included in the pigment-resin slurry as a catalyst, firstly reacting 28 can be carried out at ambient temperatures of from about 15° C. to about 35° C. and atmospheric pressure for a duration of from about 60 minutes to about 400 minutes. Firstly reacting 28 to form the coated pigment-resin slurry including the first layer 32 on the surface 26 of each of the plurality of flakes 24 may be characterized as silica encapsulation of the plurality of flakes 24.

Firstly reacting 28 may include blending the orthosilicate and the pigment in the presence of the resin in a weight ratio of parts by weight orthosilicate to parts by weight pigment of from about 0.1:1 to about 0.8:1. For example, firstly reacting 28 may include blending about 30 parts by weight of the orthosilicate and about 100 parts by weight of the pigment. An amount of the orthosilicate may be determined according to a desired thickness 34 (FIG. 3) of the first layer 32 formed from the orthosilicate. For example, firstly reacting 28 may include forming the first layer 32 so that the first layer 32 has the thickness 34 of from about 5 nm to about 50 nm, or about 20 nm. At thicknesses 34 of greater than about 50 nm, the first layer 32 may interfere with a metallic effect of the cured film 18 formed from the aqueous topcoat coating composition 14 without further protecting the pigment from corrosion or oxidation or photo-degradation, i.e., without further improving a stability of the plurality of flakes 24 upon exposure to water or light.

Therefore, referring again to the method 10, firstly reacting 28 may further include mixing the solvent, the orthosilicate, and the pigment in the presence of the resin such that the pigment-resin slurry is a compatible mixture.

After firstly reacting 28, i.e., orthosilicate encapsulation, the coated pigment may include from about 10 parts by weight to about 25 parts by weight of orthosilicate based on 100 parts by weight of the coated pigment. That is, firstly reacting 28 may include forming the first layer 32 such that the first layer 32 is present in the coated pigment in an amount of from about 10 parts by weight to about 25 parts by weight based on 100 parts by weight of the pigment, i.e., the uncoated pigment.

Firstly reacting 28 may be carried out at under basic reaction conditions, i.e., at a pH of greater than 7. For example, firstly reacting 28 may be carried out at a pH of from about 8 to 10 or from about 8.5 to about 9.5. For example, the first amine, i.e., the comparatively stronger amine, may be used in admixture with ammonia or the second amine, i.e., the comparatively weaker amine, such as dimethylethanolamine. The combination of the comparatively stronger amine and the comparatively weaker amine may be beneficial for minimizing a co-encapsulation of the plurality of flakes 24, minimizing a diminished metallic appearance of the plurality of flakes 24 in the cured film 18, and permitting a short reaction time under ambient conditions. The first amine, i.e., the comparatively stronger amine, may be present in the pigment-resin slurry in at least about 20 parts by weight based on 100 parts by weight of the total amine component present during firstly reacting 28 or orthosilicate encapsulation. When the pigment-resin slurry includes ammonia, the first amine, and water as a catalyst, the first layer 32 may be formed on the surface 26 of each of the plurality of flakes 24 after from about 1 hour to about 4 hours.

In addition, the method 10 may further include, before or concurrent to firstly reacting 28, oxidizing 58 the surface 26. That is, some samples of aluminum pigment may require further treatment in addition to firstly reacting 28 to form the coated pigment-resin slurry. For example, some samples of aluminum pigment may be packaged and transported in containers sealed with air-tight seals, and an oxygen level within the container may be insufficient to oxidize the surface 26. That is, some samples of aluminum pigment may not be adequately passivated to hydrogen gas generation in the presence of water by only firstly reacting 28 the orthosilicate and the pigment in the presence of the resin. These samples of aluminum pigment may be made suitable by oxidizing 58 in addition to firstly reacting 28 the orthosilicate and the pigment in the presence of the resin. Such oxidizing 58 may include exposing the aluminum flakes to air for from 1 month to 2 months.

In another non-limiting embodiment, oxidizing 58 may include exposing the aluminum flakes to water for from 2 days to 5 days to from 2 weeks to 5 weeks. Acid conditions may further accelerate oxidizing 58 in water. However, oxidizing 58 by water may also produce hydrogen gas.

Therefore, oxidizing 58 may alternatively include exposing the aluminum flake to a peroxide, such as hydrogen peroxide, to thereby oxidize the aluminum. In the case of hydrogen peroxide, water is formed as the byproduct at a much lower risk. The oxidation of the flake pigments with dilute hydrogen peroxide can be achieved within several hours. Other peroxides include percarbonates, organic hydroperoxides, organic peresters, organic peracids, organic peroxy ketals and organic peroxides. Amine oxides can also be used. Transition metal oxides such as molybdenum, vanadium, chromium, titanium or zirconium may also be useful for treatment of aluminum flakes in conjunction with orthosilicate encapsulation. These metal oxides are also suitable for oxidation of the aluminum.

Oxidizing 58 may occur before firstly reacting 28, or concurrent to firstly reacting 28, or even after firstly reacting 28. However, the aluminum pigment will not be stable to hydrogen generation in the presence of water until both the oxidation and orthosilicate reactions are complete, i.e., until after both firstly reacting 28 and oxidizing 58. For this reason a pre-oxidation of the aluminum surface prior to orthosilicate reaction, i.e., oxidizing 58 before firstly reacting 28, is most preferred.

Part Two: Treating the Plurality of Flakes 24 in the Presence of the Resin

Referring again to FIG. 1, the method 10 also includes, secondly reacting 36 the coated pigment-resin slurry and an organosilane compound having a hydrolysable group and an organic group to coat the first layer 32 (FIG. 3) and thereby form the passivated pigment slurry 12. That is, secondly reacting 36 may represent the aforementioned part two of the method 10, i.e., the treatment process that occurs in the presence of the resin. Secondly reacting 36 may occur after or concurrent to firstly reacting 28. The resulting passivated pigment slurry 12 includes the resin and a passivated pigment. As best shown in FIG. 3, the passivated pigment includes the plurality of flakes 24 each coated with a second layer 38 disposed on the first layer 32.

As the coated pigment-resin slurry and the organosilane compound react, the hydrolysable group of the organosilane compound may react with the first layer 32 disposed on each of the plurality of flakes 24 and formed from silica to form the second layer 38. Further, the organic group of the organosilane compound may include a functional group that can react with (a) the resin, or upon curing 42 of the aqueous topcoat coating composition 14, (b) at least one water-miscible film-forming binder of the aqueous topcoat coating composition 14, and/or (c) a crosslinking agent present in the aqueous topcoat coating composition 14. The second layer 38 may bond the plurality of flakes 24 to (a) the resin and/or (b) the at least one water-miscible film-forming binder. Conversely, the first layer 32 formed from silica may not sufficiently bond to (a) the resin and/or (b) the at least one water-miscible film-forming binder so that the coated pigment may not properly disperse within the aqueous topcoat coating composition 14 without the second layer 38.

The organosilane compound may have a structure represented by formula (I):

$$R^1_n R^2_m R^3_o SiX_{(4-n-m-o)} \qquad (I)$$

wherein X is the hydrolysable group that may be hydrolyzed to form a covalent bond to the silica of the first layer 32 disposed or deposited on the surface 26 of the plurality of flakes 24; $R^1$ is an alkylene group including the organic group; $R^2$ and $R^3$ are each independently a hydrogen atom, an alkyl group, or an alkylene group having the organic group; n, m and o are integers; n+m+o=1, 2, or 3; n=1, 2, or 3; m=0, 1, or 2; and o=0, 1, or 2. The alkylene group may be monomeric and may have one or more ether, thioether, urethane, or siloxane groups. Thus, the organosilane compound may be oligomeric or polymeric or may be a simple compound with non-repeating units.

Suitable hydrolysable groups include alkoxy groups such as methoxy groups and ethoxy groups; and halogen groups such as chloro groups. Non-limiting examples of suitable organic groups may include amino groups, isocyanate groups, epoxide groups, carboxyl groups, hydroxyl groups, carbamate groups, and groups including unsaturated bonds that can be addition polymerized, such as acrylate groups, methacrylate groups, vinyl groups, and allyl groups.

Non-limiting examples of suitable organosilane compounds include vinyl trimethoxy silane, aminopropyl triethyoxy silane, N-ethylamino-N-propyl dimethoxy silane, isocyanatopropyl triethoxy silane, mercaptopropyl trimethoxy silane, vinyl triethoxy silane, vinyl ethyl dichlorosilane, vinyl methyl diacetoxy silane, vinyl methoyl dichlorosilane, vinyl methyl diethoxy silane, vinyl triacetoxy silane, vinyl trichlorosilane, phenyl vinyl diethoxy silane, phenyl allyl dichlorosilane, 3-isocyanatopropoxyl triethoxy silane, methacryloxy propenyl trimethoxy silane, 3-methacryloxy propyl trimethoxy silane, 3-glycidyloxypropyl trimethoxy silane, 1,2-epoxy-4-(ethyl triethoxysilyl)-cyclohexane, 3-acryloxypropyl trimethoxy silane, 2-methacryloxyethyl trimethoxy silane, 2-acryloxyethyl trimethoxy silane, 3-methacryloxypropyl triethoxy silane, 3-acryloxypropyl trimethoxy silane, 2-methacryloxyethyl triethoxy silane, 2-acryloxyethyl triethoxy silane, 3-methacryloxypropyl tris(methoxyethoxy)silane, 3-methacryloxypropyl tris (butoxyethoxy)silane, 3-methacryloxypropyl tris(propoxy) silane, 3-methacryloxypropyl tris(butoxy)silane, 3-acryloxypropyl tris(methoxyethoxy)silane, 3-acryloxypropyl tris(butoxyethoxy)silane, 3-acryloxypropyl tris (propoxy)silane, 3-acryloxypropyl tris(butoxy)silane, and combinations thereof.

Other non-limiting examples of suitable organosilane compounds include 3-aminopropyltrimethoxysilane, 3-aminopropyltriethoxysilane, 3-(N-methylamino) propyltrimethoxysilane 3-mercaptopropyltrimethoxysilane, trimethoxypropylsilane, trimethoxymethylsilane, trimethoxy(polyoxyethyl)propylsilane, and (3-glycidoxypropyl)methyldiethoxysilane. Amino-functional silanes, especially 3-aminopropyltrimethoxysilane, 3-aminopropyltriethoxysilane, and 3-(N-methylamino) propyltrimethoxysilane may also be suitable.

Still other non-limiting examples of suitable organosilane compounds include silicones terminated with silanol or methoxy groups, silane-modified polyethyleneimines or polybutadienes, and polyarylalkylsilasesquioxanes or aminosilane-modified polyethylene oxide urethanes. For these organosilane compounds, molecular weights of from about 100 g/mol to about 50,000 g/mol may be suitable. Examples of commercially available organosilane compounds may include reactive silicones such as 1,7-dichlorooctamethyl-tetrasiloxane, diphenylsiloxanes terminated with silanol groups, dimethylsiloxane and diphenylsiloxane copolymers terminated with silanol and/or methoxy groups, polytrifluoropropylmethylsiloxane terminated with silanol groups, trimethoxysilylpropyl-substituted polyethyleneimine, dimethoxymethylsilylpropyl-substituted polyethyleneimine, triethoxysilyl-modified polybutadiene, dimethoxymethylsilyl-modified polybutadiene, vinylmethoxysiloxane oligomer, (N-triethoxysilylpropyl)-O-polyethylene oxide urethane, and poly(trimethylsilylpropyne) (all commercially available from ABCR GmbH & Co. of Karlsruhe, Germany). A further non-limiting example of an organosilane compound may include silane-modified phenol-formaldehyde oligomers commercially available as resoles or novolacs from Bakelite AG of Iserlohn, Germany. Specific examples of organosilane compounds may include compounds including amino functionality or glycidoxy functionality.

The coated pigment-resin slurry and the organosilane compound may be reacted at a weight ratio selected according to an average size and an average surface area of the plurality of flakes 24. That is, secondly reacting 36 may include blending the coated pigment-resin slurry and the organosilane compound in the weight ratio of parts by weight organosilane compound to parts by weight of the plurality of flakes 24 of from about 0.05:100 to about 10:100. For example, for embodiments including polymeric organosilane compounds having a comparatively high number average molecular weight, such as compounds disclosed in U.S. Pat. Nos. 5,156,677; 5,256,706; and 5,498,781 and incorporated herein by reference, secondly reacting 36 may include blending the coated pigment-resin slurry and the organosilane compound in the weight ratio of parts by weight organosilane compound to parts by weight plurality of the plurality of flakes 24 of from about 2:100 to about 10:100. Conversely, for embodiments including polymeric organosilane compounds having a comparatively low number average molecular weight, secondly reacting 36 may include blending the coated pigment-resin slurry and the organosilane compound in the weight ratio of parts by weight organosilane compound to parts by weight plurality of the plurality of flakes 24 of from about 0.05:100 to about 5:100, or from about 0.05:100 to about 2:100.

Secondly reacting 36 may be carried out under the same reaction conditions as the conditions of firstly reacting 28, i.e., the orthosilicate encapsulation process. That is, secondly reacting 36 may include blending the coated pigment-resin slurry and the organosilane compound at a temperature of from about 10° C. to about 100° C. for a duration of from about 30 minutes to about 200 hours. Further, if the organosilane compound is added to the coated pigment-resin slurry during firstly reacting 28 before the hydrolyzation reaction and condensation reactions are more than 50% complete, then the organosilane compound may become buried within the first layer 36 such that the organic groups may no longer be available for reaction. Since the organosilane compound may react with (b) the at least one water-miscible film-forming binder of the aqueous topcoat coating composition 14 upon cure, it may be most effective to add the organosilane compound after firstly reacting 28.

Forming the Aqueous Topcoat Coating Composition 14

The resulting passivated pigment slurry 12 may be used to form the aqueous topcoat coating composition 14. That is, as described with reference to FIG. 4, the method 20 of forming the aqueous topcoat coating composition 14 includes combining 22, firstly reacting 28, and secondly reacting 36 as set forth above. The method 20 also includes blending 40 the passivated pigment slurry 12, water, and the at least one water-miscible film-forming binder to form the aqueous topcoat coating composition 14.

The at least one water-miscible film-forming binder may be dissolved or dispersed in an aqueous medium. Non-limiting examples of suitable water-miscible film-forming binders may include polyurethane resins, acrylated polyurethane resins, poly(meth)acrylate polymers (acrylic polymers), polyester resins, acrylated polyester resins, and alkyd resins. The aqueous topcoat coating composition 14 may also include a binder system including more than one water-miscible film-forming binder.

Figure 5:
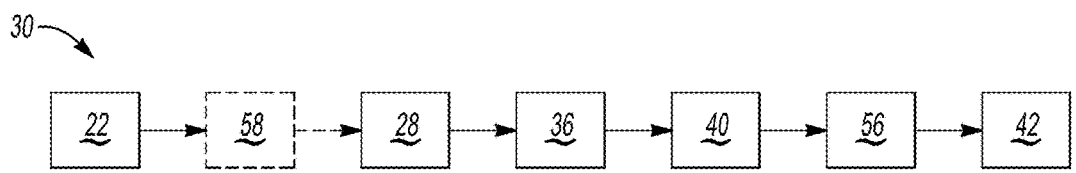
FIG. 5 is a flowchart of a method of forming an aqueous topcoat coating system.
Figure 6:
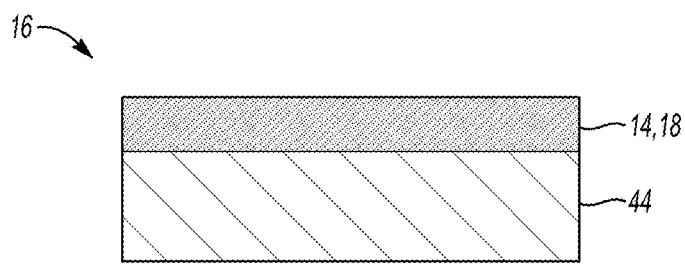
FIG. 6 is a schematic illustration of a cross-sectional view of the aqueous topcoat coating system formed by the method of FIG. 5.

The at least one water-miscible film-forming binder may be physically dried and/or chemically crosslinked, for example by polymerization, polycondensation, and/or poly-addition reactions. Chemically cross-linkable water-miscible film-forming binders may contain corresponding cross-linkable functional groups. Suitable functional groups may include, for example, hydroxyl groups, carbamate groups, isocyanate groups, acetoacetyl groups, unsaturated groups, for example, (meth)acryloyl groups, epoxide groups, carboxyl groups, and amino groups. The at least one water-miscible film-forming binder may be paired with or include a crosslinking agent. The crosslinking agent may include a complementarily-reactive functional group that may provide crosslinking during curing 42 (FIG. 5). For example, hydroxyl group-containing polymers and aminoplast (e.g., melamine) crosslinking agents may be used with chemically crosslinkable water-miscible film-forming binders.

Embodiments including aminoplast crosslinking agents may further include a strong acid catalyst to enhance curing 42 of the aqueous topcoat coating composition 14. Such catalysts may include, for example, para-toluenesulfonic acid, dinonylnaphthalene disulfonic acid, dodecylbenzenesulfonic acid, phenyl acid phosphate, monobutyl maleate, butyl phosphate, and hydroxy phosphate ester. Strong acid catalysts may also be blocked, e.g., with an amine.

The at least one water-miscible film-forming binder may include ionic and/or non-ionic groups such as carboxyl groups and polyethylene oxide segments. Suitable neutralizing agents for the carboxyl groups are basic compounds, such as tertiary amines, for example, triethylamine, dimethylethanolamine, and diethylethanolamine. Alternatively or additionally, the aqueous topcoat coating composition 14 may also include one or more external emulsifiers. The external emulsifier(s) may disperse the water-miscible film-forming binder within the aqueous topcoat coating composition 14.

In one non-limiting example, the water-miscible film-forming binder is an aqueous polyurethane dispersion. The aqueous polyurethane dispersion may be prepared by emulsifying hydrophobic polyurethanes in water with the aid of one or more external emulsifiers. The aqueous polyurethane dispersion may also be prepared to be self-dispersible by incorporating hydrophilic groups. One technique for imparting water-miscibility or -dispersibility may include converting carboxylate groups into anionic groups using an amine to form an anionic, polyurethane dispersion. Another technique for imparting water-miscibility may include first reacting tertiary amino alcohols with prepolymers which contain free isocyanate functionality, and then neutralizing the reaction product with an acid to form a cationic polyurethane dispersion. A further technique may include modifying prepolymers having free isocyanate functions with water-soluble long-chain polyethers to form a nonionic polyurethane dispersion.

The aqueous topcoat coating composition 14 may alternatively include a hybrid polyurethane-polyacrylate dispersion as the water-miscible film-forming binder. The hybrid polyurethane-polyacrylate dispersion may be prepared by emulsion-polymerizing a vinylpolymer, i.e., a polyacrylate, in an aqueous polyurethane dispersion. Alternatively, the hybrid polyurethane-polyacrylate dispersion may be prepared as a secondary dispersion.

The aqueous topcoat coating composition 14 may include the passivated pigment slurry 12 present in an amount of from about 0.01 part by weight to about 60 parts by weight, e.g., from about 0.1 part by weight to about 20 parts by weight, based on 100 parts by weight of the water-miscible film-forming binder. That is, blending 40 may include adding to water from about 30 parts by weight passivated pigment slurry 12 to about 50 parts by weight passivated pigment slurry 12 based on 100 parts by weight of the at least one water-miscible film-forming binder.

The aqueous topcoat coating composition 14 may further include a rheology control agent and/or film-forming agent such as a colloidal layered silicate. For example, the colloidal layered silicate may provide the aqueous topcoat coating composition 14 with stability and adjust a thixotropic shear-sensitive viscosity of the aqueous topcoat coating composition 14. The colloidal layered silicate may be synthetically manufactured from an inorganic mineral and may have a colloidal, gel, or sol form. A suitable colloidal layered silicate is commercially available under the trade name Laponite® from the Byk-Chemie GmbH of Wesel, Germany. Therefore, the method 20 may further include blending 40 the colloidal layered silicate, the passivated pigment slurry 12, water, and the at least one water-miscible film-forming binder to form the aqueous topcoat coating composition 14.

The aqueous topcoat coating composition 14 may also include other pigments and fillers. Non-limiting examples of other pigments and fillers may include inorganic pigments such as titanium dioxide, barium sulfate, carbon black, ocher, sienna, umber, hematite, limonite, red iron oxide, transparent red iron oxide, black iron oxide, brown iron oxide, chromium oxide green, strontium chromate, zinc phosphate, silicas such as fumed silica, calcium carbonate, talc, barytes, ferric ammonium, ferrocyanide (Prussian blue), and ultramarine, and organic pigments such as metallized and non-metallized azo reds, quinacridone reds and violets, perylene reds, copper phthalocyanine blues and greens, carbazole violet, monoarylide and diarylide yellows, benzimidazolone yellows, tolyl orange, naphthol orange, nanoparticles based on silicon dioxide, and aluminum oxide or zirconium oxide.

The pigments may be dispersed in a resin or polymer or may be present in a pigment system which includes a pigment dispersant, such as the water-miscible film-forming binder resins of the kind already described. The pigment and dispersing resin, polymer, or dispersant may be brought into contact under a shear sufficient to break any agglomerated pigment down to primary pigment particles and to wet a surface of the pigment particles with the dispersing resin, polymer, or dispersant. The breaking of the agglomerates and wetting of the primary pigment particles may provide pigment stability and robust color.

The pigments and fillers may be present in the aqueous topcoat coating composition 14 in an amount of less than or equal to about 60 parts by weight based on 100 parts by weight of the aqueous topcoat coating composition 14. For example, the pigments and fillers may be present in the aqueous topcoat coating composition in an amount of from about 0.5 parts by weight to 50 parts by weight, or from about 1 part by weight to about 30 parts by weight, or from about 2 parts by weight to about 20 parts by weight, or from about 2.5 parts by weight to about 10 parts by weight, based on 100 parts by weight of the aqueous topcoat coating composition 14. The amount of pigments and fillers present in the aqueous topcoat coating composition 14 may be selected according to a make-up or nature of the pigment, on a depth of desired color of the cured film 18 formed from the aqueous topcoat coating composition 14, on an intensity of a metallic and/or pearlescent effect of the cured film 18, and/or on a dispersibility of the pigment.

The aqueous topcoat coating composition 14 may also include additive components such as, but not limited to, surfactants, stabilizers, dispersing agents, adhesion promoters, ultraviolet light absorbers, hindered amine light stabilizers, benzotriazoles or oxalanilides, free-radical scavengers, slip additives, defoamers, reactive diluents, wetting agents such as siloxanes, fluorine compounds, carboxylic monoesters, phosphoric esters, polyacrylic acids and their copolymers, for example polybutyl acrylate and polyurethanes, adhesion promoters such as tricyclodecanedimethanol, flow control agents, film-forming assistants such as cellulose derivatives, and rheology control additives such as inorganic phyllosilicates such as aluminum-magnesium silicates, sodium-magnesium, and sodium-magnesium-fluorine-lithium phyllosilicates of the montmorillonite type. The aqueous topcoat coating composition 14 may include one or a combination of such additives.

The aqueous topcoat coating composition 14 may be suitable for coating automotive components and substrates 44 (FIG. 6) and may be suitable for original finish and refinish automotive applications. Further, the aqueous topcoat coating composition 14 may be characterized as a monocoat coating composition, and may be structured to be applied to the substrate 44 as a single, uniformly-pigmented layer. Alternatively, the aqueous topcoat coating composition 14 may be characterized as a basecoat/clearcoat coating composition, and may be structured to be applied to the substrate 44 as two distinct layers, i.e., a lower, highly pigmented layer or basecoat, and an upper layer or clearcoat having little or no pigmentation. Basecoat/clearcoat coating compositions may impart a comparatively high level of gloss and depth of color.

The passivated pigment slurry 12 may exhibit superior properties, such as an excellent resistance to settling, as compared to a comparative passivated pigment slurry that is not formed in the presence of the resin. Without intending to be limited by theory, formation of the passivated pigment slurry 12 in the presence of the resin may change a rheology of the passivated pigment slurry 12.

Figure 2:
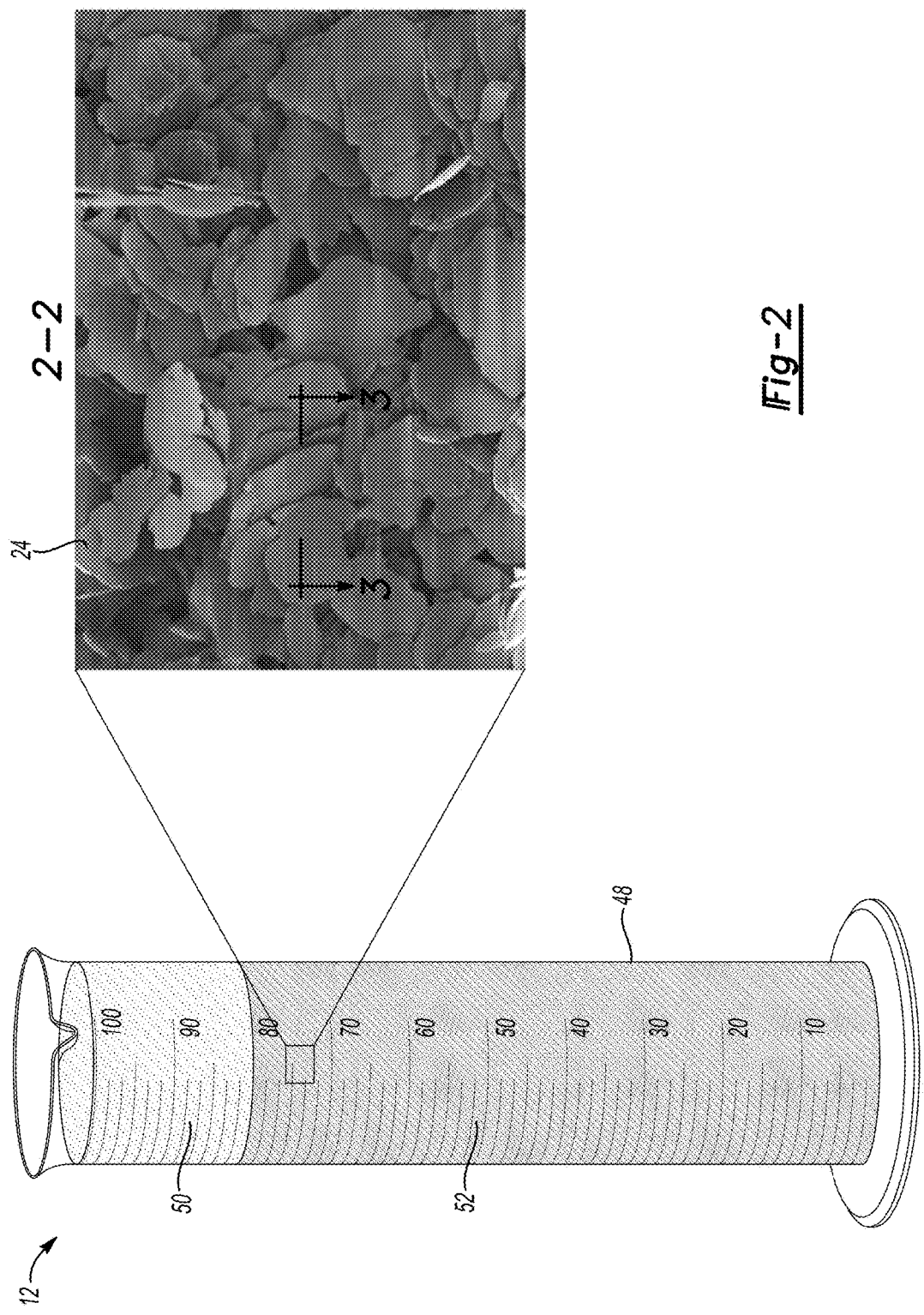
FIG. 2 is a schematic illustration of a perspective view of the passivated pigment slurry formed by the method of FIG. 1, wherein a magnified portion of the passivated pigment slurry is illustrated at section 2-2.

Therefore, referring again to the method 20 of forming the aqueous topcoat coating composition 14, the method 20 may further include, prior to blending 40, storing 46 the passivated pigment slurry 12 in a container 48 (FIG. 2) for longer than 15 consecutive days. That is, as best shown in FIG. 2, the passivated pigment slurry 12 may not settle excessively when stored for longer than 15 consecutive days.

More specifically, the container 48 may have a volume, and the method 20 may further include storing 46 the passivated pigment slurry 12 in the container 48 for longer than 30 consecutive days such that the passivated pigment slurry 12 settles to define a first portion 50 (FIG. 2) that is substantially free from the plurality of flakes 24 and a second portion 52 (FIG. 2) that includes the plurality of flakes 24, and further wherein the second portion 52 occupies greater than or equal to 75% of the volume. That is, the first portion 50 may not occupy a bottom three-quarters of the volume of the container 48, i.e., the passivated pigment slurry 12 may not exhibit excessive or detrimental settling requiring re-agitation when stored. As such, the passivated pigment slurry 12 exhibits excellent resistance to settling, i.e., the plurality of flakes 24 may not detrimentally settle out of solution upon storage for longer than 15 consecutive days without agitation. Consequently, the passivated pigment slurry 12 may be formed or produced prior to forming the aqueous topcoat coating composition 14 but may be stored over time, which may decrease manufacturing and logistical costs associated with forming the aqueous topcoat coating composition 14.

The method 20 may also further include, prior to blending 40, exposing 54 the passivated pigment slurry 12 to water without corroding the passivated pigment slurry 12. That is, the first layer 32 and the second layer 38 may provide the plurality of flakes 24 of the passivated pigment slurry 12 with excellent corrosion protection in an aqueous environment.

Forming the Aqueous Topcoat Coating System 16

Referring now to FIG. 5, the method 30 of forming the aqueous topcoat coating system 16 (FIG. 6) includes combining 22, firstly reacting 28, secondly reacting 36, and blending 40 as set forth above. The method 30 further includes applying 56 a film formed from the aqueous topcoat coating composition 14 to the substrate 44. Applying 56 may include, for example, spray coating, dip coating, roll coating, curtain coating, knife coating, spreading, pouring, dipping, impregnating, trickling, rolling, and combinations thereof. For automotive applications in which the substrate 44 is, for example, a body panel, applying 56 may include spray coating the aqueous topcoat coating composition 14 onto the substrate 44. Non-limiting examples of suitable spray coating may include compressed-air spraying, airless spraying, high-speed rotation, electrostatic spray application, hot-air spraying, and combinations thereof. During applying 56, the substrate 44 may be at rest, and application equipment configured for applying 56 the aqueous topcoat coating composition 14 to the substrate 44 may be moved.

Alternatively the substrate 44, e.g., a coil, may be moved, and the application equipment may be at rest relative to the substrate 44.

Non-limiting examples of suitable substrates 44 include metal substrates such as bare steel, phosphated steel, galvanized steel, or aluminum; and non-metallic substrates, such as plastics and composites. The substrate 44 may also include a layer formed from another coating composition, such as a layer formed from an electrodeposited primer coating composition, primer surfacer composition, and/or basecoat coating composition, whether cured or uncured.

For example, the substrate 44 may be pretreated to include a layer formed from an electrodeposition (electrocoat) primer coating composition. The electrodeposition primer coating composition may be any electrodeposition primer coating composition useful for automotive vehicle coating operations. The electrodeposition primer coating composition may have a dry film thickness of from about 10 μm to about 35 μm and may be curable by baking at a temperature of from about 135° C. to about 190° C. for a duration of from about 15 minutes to about 60 minutes. Non-limiting examples of electrodeposition primer coating compositions are commercially available under the trade name Catho-Guard® from BASF Corporation of Florham Park, N.J.

Such electrodeposition primer coating compositions may include an aqueous dispersion or emulsion including a principal film-forming epoxy resin having ionic stabilization, e.g., salted amine groups, in water or a mixture of water and an organic cosolvent. The principal film-forming resin may be emulsified with a crosslinking agent that is reactive with functional groups of the principal film-forming resin under certain conditions, such as when heated, so as to cure a layer formed from the electrodeposition primer coating composition. Suitable examples of crosslinking agents, include, without limitation, blocked polyisocyanates. The electrodeposition primer coating compositions may further include one or more pigments, catalysts, plasticizers, coalescing aids, antifoaming aids, flow control agents, wetting agents, surfactants, ultraviolet light absorbers, hindered amine light stabilizer compounds, antioxidants, and other additives.

Referring again to FIG. 5, the method 30 also includes curing 42 the film to form the aqueous topcoat coating composition 14. Curing 42 may include, for example, drying the aqueous topcoat coating composition 14 so that at least some of any solvent and/or water is stripped from the film during an evaporation phase. Drying may include heating the film at a temperature of from about room temperature to about 80° C. Subsequently, the film may be baked, for example, under conditions employed for automotive original equipment manufacturer finishing, such as at temperatures from about 30° C. to about 200° C., or from about 40° C. to about 190° C., or from about 50° C. to about 180° C., for a duration of from about 20 minutes to about 10 hours, e.g., about 20 minutes to about 30 minutes for comparatively lower baking temperatures and from about 1 hour to about 10 hours for comparatively higher baking temperatures. In one example, the film may be cured at a temperature of from about 30° C. to about 90° C. for a duration of about 1 hour.

In addition, curing 42 may not occur immediately after applying 56. Rather, curing 42 may include allowing the film to rest or "flash". That is, the film may be cured after a certain rest time or "flash" period. The rest time allows the aqueous topcoat coating composition 14 to, for example, level and devolatilize such that any volatile constituents such as solvents may evaporate. Such a rest time may be assisted or shortened by exposing the film to elevated temperatures or reduced humidity. Curing 42 of the aqueous topcoat coating composition 14 may include heating the film in a forced-air oven or irradiating the film with infrared lamps.

The resulting cured film 18 (FIG. 6) may have a thickness of from about 5 μm to about 75 μm, e.g., about 30 μm to about 65 μm, depending, for example, upon a desired color or continuity of the cured film 18. Further, the cured film 18 formed from the aqueous topcoat coating composition 14 may exhibit a metallic and/or pearlescent appearance.

Therefore, the aqueous topcoat coating system 16 may include the substrate 44 and the cured film 18 formed from the aqueous topcoat coating composition 14 and disposed on the substrate 44. Therefore, the method 30 may also include, after curing 42, exposing 54 the cured film 18 to light without photo-degrading the cured film 18. That is, the first layer 32 and the second layer 38 of the passivated pigment slurry 12 may provide the cured film 18 formed from the aqueous topcoat coating composition 14 with excellent photo-degradation protection upon exposure to wavelengths from ultraviolet light, visible light, and/or infrared radiation. Such characteristics may be especially advantageous when the plurality of flakes 24 are formed from a $TiO_2$ coated mica.

As such, the passivated pigment slurry 12 or dispersion may be used in coating compositions for original finish and refinish automotive coating compositions, such as multicoat metallic coating systems comprising, for example, at least one metallic basecoat and at least one clearcoat disposed on the at least one metallic basecoat, in which the basecoat has been produced using the passivated pigment slurry 12.

Non-limiting examples of suitable clearcoat coating compositions may include poly(meth)acrylate polymers, polyvinyl polymers, and polyurethanes. For example, the clearcoat composition may include a carbamate- and/or hydroxyl-functional poly(meth)acrylate polymer. For embodiments including a polymer having hydroxyl and/or carbamate functional groups, the crosslinking agent may be an aminoplast resin.

The methods 10, 20, 30 of this disclosure provide the passivated pigment slurry 12 which exhibits excellent storage stability and resistance to settling and degradation. In particular, an appearance of the plurality of flakes 24 may not be degraded by water and/or light over time, and the plurality of flakes 24 may be substantially free from a hydrated oxide layer disposed or deposited on the surface 26. Therefore, the plurality of flakes 24 of the passivated pigment slurry 12 are not subject to discoloration over time and/or a diminished gonioapparent effect. Further, the aqueous topcoat coating composition 14 including the passivated pigment slurry 12 is stable and forms a durable cured film 18 of the aqueous topcoat coating system 16.

While the best modes for carrying out the disclosure have been described in detail, those familiar with the art to which this disclosure relates will recognize various alternative designs and embodiments for practicing the disclosure within the scope of the appended claims.

The following examples are meant to illustrate the disclosure and are not to be viewed in any way as limiting to the scope of the disclosure.

EXAMPLES

Example 1

Passivated Pigment Slurry Formed in the Presence of a Resin

To prepare the passivated pigment slurry of Example 1, components A-H are combined in the amounts listed in Table 1. Specifically, 76 grams of component A, 75 grams of component B, 76.7 grams of component C, 2.76 grams of component D, 2.79 grams of component E, and 11.9 grams of component F are combined in a glass beaker under agitation with a blade at 1,200 revolutions per minute for 30 minutes to form a first mixture. After 30 minutes of agitation, 30.3 grams of component A and 26.1 grams of component G are mixed with the first mixture under agitation with the blade at 1,200 revolutions per minute for 90 minutes to form a second mixture. After 90 minutes of reaction, 0.53 grams of component H are reacted with the second mixture under agitation for 60 minutes to form the passivated pigment slurry of Example 1.

The passivated pigment slurry of Example 1 is removed from the glass container and poured into a 100 ml glass graduated cylinder. The passivated pigment slurry of Example 1 is visually monitored for settling. More specifically, the passivated pigment slurry of Example 1 settles over time to define a first portion that is substantially free from a plurality of flakes of component C and a second portion that includes the plurality of flakes of component C. A volume of the second portion is measured at several time intervals as listed in Table 5.

TABLE 1

Passivated Pigment Slurry Composition of Example 1

| Component | weight (grams) |
|---|---|
| Butyl cellosolve (A) | 76 |
| Polyester resin (B) | 75 |
| Metallux 2156 (C) | 76.7 |
| Butyl amine (D) | 2.76 |
| Dimethylethanolamine (E) | 2.79 |
| Water (F) | 11.9 |
| TEOS (G) | 26.1 |
| Silquest ® A-187 (H) | 0.53 |

Component A is 2-butoxyethanol and is commercially available under the trade name Butyl Cellosolve™ from The Dow Chemical Company of Midland, Mich.

Component B is a polyester resin produced from a dimer fatty acid, hexanediol, neopentylglycol, hexahydrophthalic anhydride, and trimellitic anhydride and has an acid value of 32. Component B includes 65% resin solids diluted in ethylene glycol butyl ether and water.

Component C is an aluminum paste pigment including a plurality of unencapsulated flakes formed from aluminum and having a silver dollar shape. It has an aluminum content of 71% and is commercially available under the trade name Stapa® Metallux 2156 Aluminum Paste from Eckart GmbH of Hartenstein, Germany.

Component D is n-butylamine and is commercially available from BASF Corporation of Florham Park, N.J.

Component E is N,N-dimethylethanolamine and is commercially available under the trade name Lupragen® from BASF Corporation of Florham Park, N.J.

Component F is deionized water.

Component G is a tetraethyl orthosilicate and is commercially available under the trade name Silbond® from Silbond Corporation of Weston, Mich.

Component H is an organosilane having epoxy and trimethoxy silane functionality and is commercially available under the trade name Silquest® A-187 from Momentive Performance Materials, Inc. of Columbus, Ohio.

Comparative Example 2

Comparative Pigment Slurry not Formed in the Presence of a Resin

To prepare the comparative pigment slurry of Comparative Example 2, components F, G, and J, K, M, N, and P are combined in the amounts listed in Table 3 in a flask fitted with a reflux condenser and an agitator. Specifically, 95 grams of component K are dispersed in 310 ml of component J to form a first dispersion and the first dispersion is heated to a boiling point. Then, 20 grams of component G are added to the first dispersion to form a second dispersion. After a short time, 13 g of component F is added to the second dispersion to form a third dispersion. Subsequently, component M is introduced to the third dispersion via a Dosimat over a period of 3 hours at a rate such that, during this time, a pH of 8.7 is attained and maintained. Subsequently, the reaction is continued for a further 3 hours and then a mixture of 1 gram of component N and 0.5 grams of component P is added to the third dispersion to form a fourth dispersion. The fourth dispersion is stirred overnight while cooling and filtered off with suction the following day to form the comparative pigment slurry of Comparative Example 2.

The comparative pigment slurry of Comparative Example 2 is poured into a 100 ml glass graduated cylinder. The comparative pigment slurry of Comparative Example 2 is visually monitored for settling. More specifically, the comparative pigment slurry of Comparative Example 2 settles over time to define a first portion that is substantially free from a plurality of flakes of component K and a second portion that includes the plurality of flakes of component K. A volume of the second portion is measured at several time intervals as listed in Table 5.

TABLE 2

Pigment Slurry Composition of Comparative Example 2

| Component | weight (grams) |
|---|---|
| Isopropanol (J) | 310 |
| PalioChrom ® L2000 (K) | 95 |
| TEOS (G) | 20 |
| Water (F) | 13 |
| 25% ammonia to pH 9.1 (M) | 0.1 |
| OCTEO (N) | 1 |
| AMMO (P) | 0.5 |

Component J is isopropanol and is commercially available from BASF Corporation of Florham Park, N.J.

Component K is an aluminum paste pigment including a plurality of flakes formed from aluminum, coated with iron oxide, and having a silver dollar shape and a gold color, and is commercially available under the trade name Paliocrom® L2000 from BASF Corporation of Florham Park, N.J.

Component G is a tetraethyl orthosilicate and is commercially available under the trade name Silbond® from Silbond Corporation of Weston, Mich.

Component F is deionized water.

Component M is a 25% strength aqueous ammonia solution and is commercially available from BASF Corporation of Florham Park, N.J.

Component N is a monomeric medium-chain alkylfunctional silane and is commercially available under the trade name Dynasylan® OCTEO of Evonik Industries AG of Essen, Germany.

Component P is a bifunctional organosilane including a reactive primary amine and hydrolysable inorganic methoxysilyl groups and is commercially available under the trade name Dynasylan® AMMO of Evonik Industries AG of Essen, Germany.

TABLE 3

Pigment Slurry Composition of Comparative Example 2

| Component | weight (grams) | weight % based on a total weight of the comparative pigment slurry |
|---|---|---|
| J | 310 | 70.78 |
| K | 95 | 21.69 |
| G | 20 | 4.57 |
| F | 13 | 2.97 |
| M | 0.1 | — |
| N | 1 | 0.22 |
| P | 0.5 | 0.11 |

Comparative Example 3

Comparative Encapsulated Pigment not Formed in the Presence of a Resin and Subsequently Mixed with the Resin To prepare the comparative pigment slurry of Comparative Example 3, components B, R, E, and Q are combined in the amounts listed in Table 4. Specifically, 107 grams of component R, 76 grams of component B, 104 grams of component R, and 3.8 g of a 20% solution of component E in component F are blended together to form the comparative pigment slurry of Comparative Example 3.

The comparative pigment slurry of Comparative Example 3 is poured into a 100 ml glass graduated cylinder. The comparative pigment slurry of Comparative Example 3 is visually monitored for settling. More specifically, the comparative pigment slurry of Comparative Example 3 settles over time to define a first portion that is substantially free from a plurality of flakes of component R and a second portion that includes the plurality of flakes of component R. A volume of the second portion is measured at several time intervals as listed in Table 5.

Component R is an aluminum paste pigment including a plurality of flakes formed from aluminum and having a silver dollar shape and a silica inorganic coating. It has an aluminum content of 56% and is commercially available under the trade name Hydrolan® 2156 Aluminum Paste from Eckart GmbH of Hartenstein, Germany.

Component Q is dipropyleneglycol propylether and is commercially available under the trade name DOWANOL® DPnP from The Dow Chemical Company of Midland, Mich.

TABLE 4

Pigment Slurry Composition of Comparative Example 3

| Component | weight (grams) |
|---|---|
| Dipropyleneglycol propyl ether (Q) | 117 |
| Polyester resin (B) | 76 |
| Hydrolan 2156 (R) | 104 |
| 20% DMEOA (E) solution in DI water (F) | 3.8 |

Settling Evaluation

TABLE 5

Settling of the Passivated Pigment Slurry of Example 1 and the Pigment Slurries of Comparative Examples 2 and 3

| Settling Time Interval (days) | Ex. 1: Volume of the First Portion (ml) | Comp. Ex. 2: Volume of the First Portion (ml) | Comp. Ex. 3: Volume of the First Portion (ml) |
|---|---|---|---|
| 0 | 0 | 0 | 0 |
| 1 | 0 | 60 | 24 |
| 3 | 0 | 60 | 42 |

As shown in Table 5, the first portion of the passivated pigment slurry of Example 1 has a smaller volume than the respective first portions of the comparative pigment slurries of Comparative Examples 2 and 3. Therefore, the passivated pigment slurry of Example 1 exhibits a higher resistance to settling than the comparative pigment slurries of Comparative Examples 2 and 3. The passivated pigment slurry of Example 1 is formed in the presence of component B, i.e., the resin, while the comparative pigment slurries of Comparative Examples 2 and 3 are not formed in the presence of component B. For example, component B is added for Comparative Example 3 only after component C is encapsulated by a first layer formed from silica. As such, resistance to settling increases when the passivated pigment slurry is formed by mixing and reacting, i.e., encapsulating and treating the plurality of flakes of component C, in the presence of the resin.

Example Slurries 48

Passivated Pigment Slurries Utilizing Various Resin Types

Example 4

Orthosilicate Reacted in Polyether Resin

To prepare the passivated pigment slurry of Example 4, components are combined in the amounts listed in Table 6. Specifically, 270.2 grams of component A, 91.2 grams of component S, 188.1 grams of component T, 6.1 grams of component E, 9.3 grams of component D, and 17.2 grams of component F are combined under agitation for 30 minutes. After 30 minutes of agitation, 48.6 grams of component G are mixed with the first mixture under agitation. After 90 minutes of agitation, an additional 19.4 grams of component G are added. After 60 minutes of agitation, an additional 9.8 grams of component G are added. After 90 minutes, 1.5 grams of component H are added. After an additional 60 minutes, 164.1 grams of component B and 1.4 grams of component U are added to form the passivated pigment slurry of Example 4. After 3 days of storage, the volume of the second portion is less than 10% of the total volume.

TABLE 6

Passivated Pigment Slurry Composition of Example 4 - Polyether Resin

| Component | weight |
|---|---|
| butyl cellosolve (A) | 270.2 |
| Polyether resin (S) | 91.2 |
| Metallux 2192 (T) | 188.1 |
| dimethylethanolamine (E) | 6.1 |
| butylamine (D) | 9.3 |

TABLE 6-continued

Passivated Pigment Slurry Composition
of Example 4 - Polyether Resin

| Component | weight |
|---|---|
| water (F) | 17.2 |
| TEOS (G) | 48.6 |
| TEOS (G) | 19.4 |
| TEOS (G) | 9.8 |
| Silquest ® A187 (H) | 1.5 |
| polyester resin (B) | 164.1 |
| Rheovis ® AS1130 solution (U) | 1.4 |

Component S is a propylene glycol polyol formed by adding propylene oxide to a propylene glycol nucleus and having a hydroxyl number of from 102 mg KOH/g to 112 mg KOH/g, an acid number of 0.04, and a nominal molecular weight of 1,000 g/mol, and commercially available under the trade name Pluracol® P1010 from BASF Corporation of Florham Park, N.J.

Component T is an aluminum paste pigment including a plurality of flakes formed from aluminum and having a silver dollar shape. It has an aluminum content of 53% and is commercially available under the trade name Stapa® Metallux 2192 Aluminum Paste from Eckart GmbH of Hartenstein, Germany.

Component U is a solution of 10% by weight Rheovis® AS1130 and 90% deionized water. Rheovis® AS1130 is commercially available from BASF Corporation of Florham Park, N.J.

Example 5

Orthosilicate Reacted in Aminoplast Resin

To prepare the passivated pigment slurry of Example 5, components are combined in the amounts listed in Table 7. Specifically, 193.4 grams of component A, 126.8 grams of component V, 150.9 grams of component T, 4.9 grams of component E, 7.5 grams of component D, and 1.3 grams of component F are combined under agitation for 30 minutes. After 30 minutes of agitation, 38.9 grams of component G are mixed with the first mixture under agitation. After 90 minutes of agitation, an additional 15.5 grams of component G are added. After 60 minutes of agitation, an additional 7.9 grams of component G are added. After 90 minutes, 1.2 grams of component H are added. After an additional 60 minutes, 131.6 grams of component B and 1.1 grams of component U are added to form the passivated pigment slurry of Example 5. After 3 days of storage, the volume of the second portion is less than 5% of the total volume.

TABLE 7

Passivated Pigment Slurry Composition
of Example 5 - Aminoplast Resin

| Component | weight |
|---|---|
| butyl cellosolve (A) | 193.4 |
| Aminoplast resin (V) | 126.8 |
| Metallux 2192 (T) | 150.9 |
| dimethylethanolamine (E) | 4.9 |
| butylamine (D) | 7.5 |
| water (F) | 1.3 |
| TEOS (G) | 38.9 |
| TEOS (G) | 15.5 |
| TEOS (G) | 7.9 |
| Silquest ® A187 (H) | 1.2 |

TABLE 7-continued

Passivated Pigment Slurry Composition
of Example 5 - Aminoplast Resin

| Component | weight |
|---|---|
| polyester resin (B) | 131.6 |
| Rheovis ® AS1130 solution (U) | 1.1 |

Component V is Resimene AQ2609, a commercial melamine formaldehyde resin from Ineos Melamines of Rolle, Switzerland.

Example 6

Orthosilicate Reacted in Acrylic Resin

To prepare the passivated pigment slurry of Example 6, components are combined in the amounts listed in Table 8. Specifically, 222.2 grams of component A, 151.7 grams of component W, 192.4 grams of component T, 17.4 grams of component D, and 12.0 grams of component F are combined under agitation for 30 minutes. After 30 minutes of agitation, 50.0 grams of component G are mixed with the first mixture under agitation. After 90 minutes of agitation, an additional 20.0 grams of component G are added. After 60 minutes of agitation, an additional 10.0 grams of component G are added. After 90 minutes, 1.5 grams of component H are added. After an additional 60 minutes, 1.5 grams of component U are added to form the passivated pigment slurry of Example 6. After 3 days of storage, the volume of the second portion is less than 5% of the total volume.

TABLE 8

Passivated Pigment Slurry Composition
of Example 6 - Acrylic Resin

| Component | weight |
|---|---|
| butyl cellosolve (A) | 222.2 |
| Acrylic resin (W) | 151.7 |
| Metallux 2192 (T) | 192.4 |
| butylamine (D) | 17.4 |
| water (F) | 12.0 |
| TEOS | 50.0 |
| TEOS | 20.0 |
| TEOS | 10.0 |
| Silquest ® A187 (H) | 1.5 |
| Rheovis ® AS1130 solution (U) | 1.5 |

Component W is a copolymer of acrylic acid, 2-hydroxyethylacrylate, 2-ethylhexylacrylate, styrene, n-butylmethacrylate with an acid value of 46 and a hydroxyl value of 90. It is dissolved in butyl cellosolve at 68% solids.

Example 7

Orthosilicate Reacted in Blend of Aminoplast and Polyester Resins

To prepare the passivated pigment slurry of Example 7, components are combined in the amounts listed in Table 9. Specifically, 96.5 grams of component A, 98.4 grams of component C, 33.1 grams of component G, 71.1 grams of component B, 68.6 grams of component V, 4.3 grams of component D, 1.1 grams of component E and 4.1 grams of component F are combined under agitation. Although the reactive orthosilicate (component G) is added before the resins, the reaction of the orthosilicate does not begin until the catalysts (components D, E and F) are added. After 120 minutes of agitation, 0.7 grams of component H are added. After an additional 60 minutes, the passivated pigment slurry of Example 7 is complete. After 3 days of storage, the volume of the second portion is less than 15% of the total volume.

TABLE 9

Passivated Pigment Slurry Composition of Example 7 - Blend of Aminoplast and Polyester Resins

| Component | weight |
|---|---|
| butyl cellosolve (A) | 96.5 |
| Metallux 2156 (C) | 98.4 |
| TEOS (G) | 33.1 |
| polyester resin (B) | 71.1 |
| Aminoplast resin (V) | 68.6 |
| butylamine (D) | 4.3 |
| dimethylethanolamine (E) | 1.1 |
| water (F) | 4.1 |
| Silquest ® A187 (H) | 0.7 |

Example 8

Orthosilicate Reacted in Acrylic Resin with Aluminum Pre-Oxidation Step

To prepare the passivated pigment slurry of Example 8, components are combined in the amounts listed in Table 10. Specifically, 228.3 grams of component A, 197.8 grams of component T and 21.7 grams of component X are combined under agitation. After 5 hours under agitation, 156.1 grams of component W, 82.0 grams of component G, 2.4 grams of component D, and 11.9 grams of component E are combined under agitation. After 14 hours of agitation, 1.5 grams of component H are added. After an additional 60 minutes, 2.8 grams of component U are added to form the passivated pigment slurry of Example 8. After 3 days of storage, the volume of the second portion is less than 10% of the total volume.

TABLE 10

Passivated Pigment Slurry Composition of Example 8 - Acrylic Resin with Aluminum Pre-Oxidation Step

| Component | weight |
|---|---|
| butyl cellosolve (A) | 228.3 |
| Metallux 2192 (T) | 197.8 |
| peroxide solution (X) | 21.7 |
| Acrylic resin (W) | 156.1 |
| TEOS (G) | 82.0 |
| butylamine (D) | 2.4 |
| dimethylethanolamine (E) | 11.9 |
| Silquest ® A187 (H) | 1.5 |
| Rheovis ® AS1130 solution (U) | 2.8 |

Component X is 33.3 weight percent hydrogen peroxide in deionized water (component F).

Comparative Example 9

Comparative Encapsulated Pigment not Formed in the Presence of a Resin and Subsequently Mixed with the Resin To prepare the comparative pigment slurry of Comparative Example 9, components B, A, and Y are combined in the amounts listed in Table 11. Specifically, 66.9 grams of component A, 37 g of component B, 93.9 g of component Y and 5.8 grams of a 20% solution of component E in water are blended together to form the comparative pigment slurry of Comparative Example 9. After 3 days of storage, the volume of the second portion is greater than 50% of the total volume.

TABLE 11

Pigment Slurry Composition of Comparative Example 9

| Component | weight |
|---|---|
| butyl cellosolve (A) | 66.9 |
| polyester resin (B) | 37.0 |
| Hydrolan ® 2192 (Y) | 93.9 |
| 20% DMEOA (E) solution in water | 5.8 |

Component Y is an aluminum paste pigment including a plurality of flakes formed from aluminum and having a silver dollar shape and a silica inorganic coating, and is commercially available under the trade name Hydrolan® 2192 Aluminum Paste from Eckart GmbH of Hartenstein, Germany.

Basecoat Examples 10-15

Prepared from Passivated Slurries of Examples 4-8 and Comparative Example 9

To form the aqueous basecoat coating compositions of Example 10-15, the pigment slurries of Examples 4-8 are added to resin and additive premixes. The premixes are prepared by mixing the materials in the amounts that are listed in Table 12. After the resin and additive premixes are blended, the slurries prepared in Examples 4-8 are added in the amounts listed in Table 12. The basecoat compositions are then adjusted to pH 8.2 with dimethylethanolamine (component E) and the viscosity is adjusted to 80 centipoise at 380 s-1 shear rate with water (component F).

TABLE 12

Basecoat Compositions Using Slurries 4-8 and Comparative Slurry 9

| Component | Example 10 | Example 11 | Example 12 | Example 13 | Example 14 | Comp. Example 15 |
|---|---|---|---|---|---|---|
| 3.5% Laponite solution (AG) | 281.2 | 287.7 | 287.5 | 283.9 | 380.0 | 387.1 |

TABLE 12-continued

Basecoat Compositions Using Slurries 4-8 and Comparative Slurry 9

| Component | Example 10 | Example 11 | Example 12 | Example 13 | Example 14 | Comp. Example 15 |
|---|---|---|---|---|---|---|
| polyurethane resin (Z) | 357.4 | 365.7 | 365.5 | 361.0 | 453.7 | 500.0 |
| water (F) | 7.9 | 8.1 | 8.1 | 7.9 | 0.0 | |
| PUR Acrylic (AA) | 60.3 | 61.7 | 61.6 | 61.2 | 62.4 | 64.5 |
| 2-ethylhexanol (AB) | 13.7 | 13.7 | 13.7 | 13.7 | | |
| butyl cellosolve (A) | | | | | 18.0 | 12.0 |
| Rheovis ® PU 1250 solution (AC) | 11.0 | 11.2 | 11.2 | 11.0 | | |
| water (F) | 17.8 | 18.1 | 18.2 | 17.8 | | |
| Rheovis ® AS 1130 solution (U) | 98.0 | 100.3 | 103.2 | 102.5 | | |
| water (F) | 25.4 | 26.0 | 26.0 | 25.7 | | |
| BYK 347 (AD) | 7.4 | 7.5 | 7.5 | 7.4 | 4.4 | 4.6 |
| Pluracol P1010 (S) | | 17.5 | 17.5 | 17.5 | | |
| Resimene HM2608 (AE) | 51.3 | | 52.4 | | 49.2 | 50.2 |
| Tinuvin 1130 (AF) | | | | | 3.8 | 3.8 |
| Slurry of Example 4 | 268.0 | | | | | |
| Slurry of Example 5 | | 221.1 | | | | |
| Slurry of Example 6 | | | 213.2 | | | |
| Slurry of Example 7 | | | | 283.4 | | |
| Slurry of Example 8 | | | | | 214.8 | |
| Slurry of Comparative Example 9 | | | | | | 165.0 |

Component Z is a 28% solids solution of a dimer fatty acid-based polyurethane resin having an acid number of 23 and a weight average molecular weight of 15,000 Daltons and is further described by U.S. Pat. No. 4,791,168.

Component AA is a PUR-Acrylic hybrid resin described by U.S. Pat. No. 6,001,915.

Component AB is the solvent 2-ethylhexanol and is commercially available from The Dow Chemical Company of Midland, Mich.

Component AC is a solution containing 50% butyl cellosolve (component A) and 50% Rheovis® PU 1250, a HEUR thickener. It is commercially available from BASF Corporation of Florham Park, N.J.

Component AD is a silicone wetting additive BYK 347. It is commercially available from BYK-Chemie GmbH in Wesel Germany.

Component AE is a water-miscible film-forming binder commercially available under the trade name Resimene® HM 2608 from Ineos Melamines of Rolle, Switzerland.

Component AF is Tinuvin® 1130, a UV light absorber. It is commercially available from BASF Corporation of Florham Park, N.J.

Component AG is a colloidal layered silicate solution includes 92.7 parts by weight of component E; 3.5 parts by weight of a colloidal layered silicate that is commercially available under the trade name Laponite® RD from the Byk-Chemie GmbH of Wesel, Germany; and 3.5 parts by weight of Pluracol® P1010 (component S).

Evaluation of Basecoat Compositions 10-15

Test A—Gassing

The gassing test evaluates the effectiveness of the passivation layer on the aluminum flakes by measuring the amount of hydrogen gas evolved from the waterbasecoat over a 28 day period at 40° C. After reduction of the basecoats, 250 grams of each sample is placed into a gas washing bottle and affixed with a bubble counter. This apparatus is placed in a 40° C. water bath for 28 days and the gas evolution is recorded. Values less than 23 ml are considered passing.

Test B—Metallic Effect

The metallic effect test evaluates the goniochromatic effect of the aluminum flakes in the coated film. The goniochomatic effect is the ability of a pigment to provide color variation with regard to viewing angle on the coated substrate. This test is sensitive to any agglomeration of the aluminum flakes that occurs during the encapsulation process (co-encapsulation). For this test, each of the basecoat compositions are coated by drawdown onto an electrocoated steel panel to a thickness of 13-18 microns of dry film. The film is flashed for 10 minutes at 70° C. and then cured in a bake oven for 30 minutes at a temperature of 140° C. After curing, each panel is measured with an X-Rite® goniospectrophotometer. The metallic effect is calculated by the difference between L* (lightness) at 15 degrees from specular and L* at 110 degrees from specular. The L* (lightness) value of metallic finishes is higher near to specular (angle of observation equals angle of reflection) and falls to lower values as the observation angle moves further from specular. Thus higher values are better.

TABLE 13

Evaluation of Basecoat Compositions 10-15

| Basecoat | Test A gassing (ml) | Test B metallic effect |
| --- | --- | --- |
| Example 10 | 6 | 132 |
| Example 11 | 10 | 118 |
| Example 12 | 8 | 127 |
| Example 13 | not tested | 133 |
| Example 14 | 4 | 136 |
| Comparative Example 15 | 14 | 125 |

As shown in Table 13, the inventive flake pigment slurries have acceptable corrosion resistance as evidenced by the low volumes of hydrogen gas generated from the water-basecoats containing these slurries. In addition, the metallic effect of these slurries is also acceptable. This demonstrates good separation and alignment of the aluminum flake pigments in the cured film. Thus, a wide variety of organic resins can be included in the slurry formulas without compromising the integrity of the silica layer and without causing agglomeration during in the slurry or in the basecoat. Furthermore, significant improvements in settling are seen in the inventive slurries compared to the comparative slurry.

Example 16

Slurry of Iron Oxide Coated Aluminum Pigment

To prepare the passivated pigment slurry of Example 16, the components are combined in the amounts listed in Table 14. Specifically, 66.4 grams of component A, 58.3 grams of component B, 65.8 grams of component AH, 3.7 grams of component D and 8.0 grams of component F are combined under agitation to form a first mixture. After 30 minutes of agitation, 17.7 grams of component G are mixed with the first mixture under agitation. After 180 minutes of agitation, 0.35 grams of component H are reacted with the second mixture under agitation for 60 minutes to form the passivated pigment slurry of Example 16.

TABLE 14

Passivated Pigment Slurry Composition of Example 16

| Component | weight (grams) |
| --- | --- |
| Butyl cellosolve (A) | 66.4 |
| Polyester resin (B) | 58.3 |
| Paliocrom ® Orange L2800 (AH) | 65.8 |
| Butyl amine (D) | 3.7 |
| Water (F) | 8.0 |
| TEOS (G) | 17.7 |
| Silquest ® A-187 (H) | 0.35 |

Component AH is an iron oxide coated aluminum flake pigment. It is 65% solids content and is commercially available from BASF Corporation of Florham Park, N.J.

Example 17

Slurry of Titanium Dioxide Coated Mica Pigment

To prepare the passivated pigment slurry of Example 17, the components are combined in the amounts listed in Table 15. Specifically, 89.4 grams of component A, 58.3 grams of component B, 42.8 grams of component AI and 3.7 grams of component D are combined under agitation for 30 minutes to form a first mixture. After 30 minutes of agitation, 19.6 grams of component G are mixed with the first mixture under agitation. After 180 minutes of agitation, 0.35 grams of component H are reacted with the second mixture under agitation for 60 minutes to form the passivated pigment slurry of Example 17.

TABLE 15

Encapsulated Pigment Slurry Composition of Example 17

| Component | weight (grams) |
| --- | --- |
| Butyl cellosolve (A) | 208.7 |
| Polyester resin (B) | 136.1 |
| Iriodin 225 (AI) | 99.9 |
| Butyl amine (D) | 8.6 |
| TEOS (G) | 45.8 |
| Silquest ® A-187 (H) | 0.8 |

Component AI is a titanium dioxide coated mica flake pigment. It is 100% solids content and is commercially available from Merck KGaA in Darmstadt, Germany.

The invention claimed is:

1. A method of forming a passivated pigment slurry for an aqueous topcoat coating composition, the method comprising:
combining a resin and a pigment to form a pigment-resin slurry, wherein the pigment includes a plurality of flakes each having a surface, wherein the surface is formed from aluminum;
after combining, adding an orthosilicate and firstly reacting the orthosilicate and the pigment in the presence of the resin to form a coated pigment-resin slurry, wherein the coated pigment-resin slurry includes:
the resin; and
a coated pigment including the plurality of flakes each encapsulated by a first layer formed from the orthosilicate and disposed on the surface;
before or concurrent to firstly reacting, oxidizing the surface; and
concurrent to or after firstly reacting, secondly reacting the coated pigment-resin slurry and an organosilane compound having a hydrolysable group and an organic group to coat the first layer and thereby form the passivated pigment slurry, wherein the passivated pigment-resin slurry includes:
the resin; and
a passivated pigment including the plurality of flakes each coated with a second layer disposed on the first layer.

2. The method of claim 1, wherein combining includes slurrying the pigment and the resin at a weight ratio of parts by weight pigment to parts by weight resin of from about 100:30 to about 30:100.

3. The method of claim 1, wherein firstly reacting includes mixing a solvent, the orthosilicate, and the pigment in the presence of the resin.

4. The method of claim 1, wherein combining further includes slurrying a first amine having a logarithmic acid dissociation constant, $pK_a$, of greater than or equal to 9, a second amine having a $pK_a$ of less than 9, the pigment, and the resin.

5. The method of claim 1, wherein firstly reacting includes blending the pigment-resin slurry and the orthosilicate at a temperature of from about 10° C. to about 100° C. for a duration of from about 30 minutes to about 200 hours.

6. The method of claim 1, wherein firstly reacting includes blending about 60 parts by weight of the orthosilicate and about 100 parts by weight of the pigment.

7. The method of claim 1, wherein firstly reacting includes forming the first layer such that the first layer is present in the coated pigment in an amount of from about 10 parts by weight to about 25 parts by weight based on 100 parts by weight of the pigment.

8. The method of claim 1, wherein secondly reacting includes blending the coated pigment-resin slurry and the organosilane compound in a weight ratio of parts by weight organosilane compound to parts by weight plurality of flakes of from about 0.05:100 to about 10:100.

9. The method of claim 1 wherein secondly reacting includes blending the coated pigment-resin slurry and the organosilane compound at a temperature of from about 10° C. to about 100° C. for a duration of from about 30 minutes to about 200 hours.

10. The method of claim 1, wherein firstly reacting includes forming the first layer so that the first layer has a thickness of from about 5 nm to about 50 nm.

11. A method of forming an aqueous topcoat coating composition, the method comprising:
combining a resin and a pigment to form a pigment-resin slurry, wherein the pigment includes a plurality of flakes each having a surface, wherein the surface is formed from aluminum:
after combining, adding an orthosilicate and firstly reacting the orthosilicate and the pigment in the presence of the resin to form a coated pigment-resin slurry, wherein the coated pigment-resin slurry includes:
the resin; and
a coated pigment including the plurality of flakes each encapsulated by a first layer formed from the orthosilicate and disposed on the surface;
before or concurrent to firstly reacting, oxidizing the surface;
concurrent to or after firstly reacting, secondly reacting the coated pigment-resin slurry and an organosilane compound having a hydrolysable group and an organic group to coat the first layer and thereby form the passivated pigment slurry, wherein the passivated pigment slurry includes:
the resin; and
a passivated pigment including the plurality of flakes each coated with a second layer disposed on the first layer; and
blending the passivated pigment slurry, water, and at least one water-miscible film-forming binder to form the aqueous topcoat coating composition.

12. The method of claim 11, further including, prior to blending, storing the passivated pigment slurry in a container for longer than 15 consecutive days.

13. The method of claim 12, wherein the container has a volume, and further including, prior to blending, storing the passivated pigment slurry in the container for longer than 30 consecutive days such that the passivated pigment slurry settles to define a first portion that is substantially free from the plurality of flakes and a second portion that includes the plurality of flakes, and further wherein the second portion occupies greater than or equal to 75% of the volume.

14. The method of claim 11, further including blending a colloidal layered silicate, the passivated pigment slurry, water, and the at least one water-miscible film-forming binder.

15. The method of claim 11, further including, prior to blending, exposing the passivated pigment slurry to water without corroding the passivated pigment slurry.

16. The method of claim 11, wherein blending includes adding to water from about 0.1 part by weight passivated pigment to about 30 parts by weight passivated pigment based on 100 parts by weight of the at least one water-miscible film-forming binder.

17. A method of forming an aqueous topcoat coating system, the method comprising:
combining a resin and a pigment to form a pigment-resin slurry, wherein the pigment includes a plurality of flakes each having a surface, wherein the surface is formed from aluminum:
after combining, adding an orthosilicate and firstly reacting the orthosilicate with the pigment in the presence of the resin to form a coated pigment-resin slurry, wherein the coated pigment-resin slurry includes:
the resin; and
the plurality of flakes each encapsulated by a first layer formed from the orthosilicate and disposed on the surface;
before or concurrent to firstly reacting, oxidizing the surface:
concurrent to or after firstly reacting, secondly reacting the coated pigment-resin slurry and an organosilane compound having a hydrolysable group and an organic group to coat the first layer and thereby form the passivated pigment slurry, wherein the passivated pigment slurry includes:
the resin; and
the plurality of flakes each coated with a second layer disposed on the first layer;
blending the passivated pigment slurry, water, and at least one water-miscible film-forming binder to form an aqueous topcoat coating composition;
applying a film formed from the aqueous topcoat coating composition to a substrate; and
curing the film to form the aqueous topcoat coating system.

18. The method of claim 17, wherein the aqueous topcoat coating system includes the substrate and a cured film formed from the aqueous topcoat coating composition and disposed on the substrate, and further including, after curing, exposing the cured film to light without photo-degrading the cured film.

* * * * *

UNITED STATES PATENT AND TRADEMARK OFFICE
CERTIFICATE OF CORRECTION

PATENT NO. : 10,273,371 B2
APPLICATION NO. : 15/218350
DATED : April 30, 2019
INVENTOR(S) : Donald Campbell et al.

It is certified that error appears in the above-identified patent and that said Letters Patent is hereby corrected as shown below:

In the Specification

Column 5, Line 45, "ricinolic" should read --ricinoleic--.

Column 7, Line 5, "1,2-cyclohexanedicarboxlic" should read --1,2-cyclohexanedicarboxylic--;
Line 6, "discarboxlic" should read --discarboxylic--;
Lines 6 & 7, "dicarboxlic" should read --dicarboxylic--;
Lines 7-8, "endomethylenetetrahydropthalic" should read --endomethylenetetrahydrophthalic--;
Line 8, "dicarboxlic" should read --dicarboxylic--;
Line 9, "endoethylenehexahydropthalic" should read --endoethylenehexahydrophthalic--;
Lines 9-10, "cyclohexanetetracarboxlic" should read --cyclohexanetetracarboxylic--.

Column 8, Line 48, "Acyrlic" should read --Acrylic--.

Column 9, Line 32, "dispersability" should read --dispersibility--.

Column 13, Line 55, "methoyl" should read --methyl--.

Column 22, Line 43, TABLE 2, under Component, "PalioChrom" should read --Paliocrom--.

Column 28, Line 56, "380 s-1" should read --380s-1--.

Column 30, Line 51, "goniochomatic" should read --goniochromatic--.

In the Claims

Column 32, Line 31, Claim 1, "aluminum:" should read --aluminum;--.

Signed and Sealed this
Twenty-eighth Day of January, 2020

Andrei Iancu
*Director of the United States Patent and Trademark Office*

CERTIFICATE OF CORRECTION (continued)
U.S. Pat. No. 10,273,371 B2

Column 33, Line 14, Claim 9, "claim 1" should read --claim 1,--;
    Line 27, Claim 11, "aluminum:" should read --aluminum;--.

Column 34, Line 23, Claim 17, "aluminum:" should read --aluminum;--.